United States Patent
Bae et al.

(10) Patent No.: US 9,847,140 B2
(45) Date of Patent: Dec. 19, 2017

(54) STORAGE DEVICE AND OPERATING METHOD OF STORAGE DEVICE

(71) Applicants: Hae-Sung Bae, Hwaseong-si (KR); Taekkyun Lee, Suwon-si (KR); Hyun-Ju Kim, Hwaseong-si (KR); Hwan-Chung Kim, Namwon-si (KR); Jonghwan Lee, Suwon-si (KR); Young Woo Jung, Gunpo-si (KR)

(72) Inventors: Hae-Sung Bae, Hwaseong-si (KR); Taekkyun Lee, Suwon-si (KR); Hyun-Ju Kim, Hwaseong-si (KR); Hwan-Chung Kim, Namwon-si (KR); Jonghwan Lee, Suwon-si (KR); Young Woo Jung, Gunpo-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 0 days.

(21) Appl. No.: 14/885,409

(22) Filed: Oct. 16, 2015

(65) Prior Publication Data

US 2016/0147452 A1    May 26, 2016

(30) Foreign Application Priority Data

Nov. 24, 2014  (KR) .................. 10-2014-0164543

(51) Int. Cl.
  *G11C 29/02*  (2006.01)
  *G06F 13/16*  (2006.01)

(52) U.S. Cl.
  CPC ........ *G11C 29/028* (2013.01); *G06F 13/1689* (2013.01); *G11C 29/023* (2013.01)

(58) Field of Classification Search
  CPC ................ G11C 29/028; G11C 29/023; G11C 29/12015
  See application file for complete search history.

(56) References Cited

U.S. PATENT DOCUMENTS

| | | | |
|---|---|---|---|
| 7,679,133 B2 | 3/2010 | Son et al. | |
| 8,296,467 B2 | 10/2012 | Lee et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2006/0023544 A1* | 2/2006 | Yamada ................ | G11C 29/46 365/222 |
| 2009/0121271 A1 | 5/2009 | Son et al. | |

(Continued)

FOREIGN PATENT DOCUMENTS

| | | |
|---|---|---|
| KR | 20140035772 A | 3/2014 |
| KR | 2016-0018302 A | 2/2016 |

*Primary Examiner* — Eric S Cardwell
(74) *Attorney, Agent, or Firm* — Harness, Dickey & Pierce

(57) ABSTRACT

An operating method of a storage device which includes a nonvolatile memory and a memory controller configured to control the nonvolatile memory, may include tracking a clock signal; entering a vendor mode of the storage device when the clock signal corresponds to a vendor pattern; and maintaining a normal mode of the storage device when the clock signal does not correspond to the vendor pattern, wherein, in the normal mode, a command received from an external host device is executed according to a first rule, and wherein, in the vendor mode, the command received from the external host device is executed according to a second rule different from the first rule.

19 Claims, 19 Drawing Sheets

(56) References Cited

U.S. PATENT DOCUMENTS

| | | |
|---|---|---|
| 2011/0066837 A1 | 3/2011 | Lee et al. |
| 2011/0216603 A1 | 9/2011 | Han et al. |
| 2011/0233648 A1 | 9/2011 | Seol et al. |
| 2012/0042116 A1 | 2/2012 | Park et al. |
| 2012/0051143 A1 | 3/2012 | Yoon et al. |
| 2012/0278532 A1 | 11/2012 | Bolanowski |
| 2013/0145085 A1 | 6/2013 | Yu et al. |
| 2013/0159733 A1 | 6/2013 | Lee et al. |
| 2013/0205068 A1 | 8/2013 | Kettner |
| 2013/0279262 A1 | 10/2013 | Yoon et al. |
| 2013/0343131 A1 | 12/2013 | Wu et al. |
| 2014/0059656 A1 | 2/2014 | Maeda et al. |
| 2014/0082224 A1 | 3/2014 | Kim et al. |
| 2014/0082398 A1 | 3/2014 | Lee et al. |
| 2014/0122833 A1 | 5/2014 | Davis et al. |
| 2016/0034203 A1* | 2/2016 | Jang ............... G06F 3/0611 710/14 |

* cited by examiner

FIG. 15

| Embodiment | Elements of pattern | Length of elements of pattern | tTRACK |
|---|---|---|---|
| 1 | Pattern of different frequencies of CLK | The same time duration for each element of pattern | Do not define tTRACK |
| 2 | | | Define tTRACK with L_CR or L_D1~L_Dn |
| 3 | | | Define tTRACK with PAT |
| 4 | | The same number of cycles for each element of pattern | Do not define tTRACK |
| 5 | | | Define tTRACK with L_CR or L_D1~L_Dn |
| 6 | | | Define tTRACK with PAT |
| 7 | | Different time durations for elements of pattern | Do not define tTRACK |
| 8 | | | Define tTRACK with L_CR or L_D1~L_Dn |
| 9 | | | Define tTRACK with PAT |
| 10 | | Different numbers of cycles for elements of pattern | Do not define tTRACK |
| 11 | | | Define tTRACK with L_CR or L_D1~L_Dn |
| 12 | | | Define tTRACK with PAT |
| 13 | Pattern of different duty ratios of CLK | The same time duration (or numbers of cycles) for each element of pattern | Do not define tTRACK |
| 14 | | | Define tTRACK with L_CR or L_D1~L_Dn |
| 15 | | | Define tTRACK with PAT |
| 16 | | Different time durations (or numbers of cycles) for elements of pattern | Do not define tTRACK |
| 17 | | | Define tTRACK with L_CR or L_D1~L_Dn |
| 18 | | | Define tTRACK with PAT |
| 19 | Pattern of activation and inactivation of CLK | The same time duration (or numbers of cycles) for each element of pattern | Do not define tTRACK |
| 20 | | | Define tTRACK with L_CR or L_D1~L_Dn |
| 21 | | | Define tTRACK with PAT |
| 22 | | Different time durations (or numbers of cycles) for elements of pattern | Do not define tTRACK |
| 23 | | | Define tTRACK with L_CR or L_D1~L_Dn |
| 24 | | | Define tTRACK with PAT |

STORAGE DEVICE AND OPERATING METHOD OF STORAGE DEVICE

CROSS-REFERENCE TO RELATED APPLICATIONS

A claim for priority under 35 U.S.C. §119 is made to Korean Patent Application No. 10-2014-0164543 filed Nov. 24, 2014, in the Korean Intellectual Property Office, the entire contents of which are hereby incorporated by reference.

BACKGROUND

Embodiments of the inventive concepts described herein relate to a semiconductor memory, and more particularly, relate to a storage device and an operating method thereof.

A semiconductor memory device is a storage device which is fabricated using semiconductors such as, but not limited to, silicon (Si), germanium (Ge), gallium arsenide (GaAs), and indium phosphide (InP). Semiconductor memory devices are classified into volatile memory devices and nonvolatile memory devices.

The volatile memory devices may lose contents stored therein at power-off. The volatile memory devices include the following: a static RAM (SRAM), a dynamic RAM (DRAM), and a synchronous DRAM (SDRAM). The nonvolatile memory devices may retain stored contents even at power-off. The nonvolatile memory devices include the following: a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

A storage device is implemented using a nonvolatile memory. The storage device consists of a nonvolatile memory and a memory controller to access the nonvolatile memory and communicate with an external host device.

The storage device is mounted on various mobile devices, such as a smart phone and a smart pad and is implemented in the form of product such as a solid state drive. The performance of reliability of the storage device affects the whole performance and reliability of various devices that use the storage device. Thus, there is continuously required a research on improving the performance and reliability of the storage device.

SUMMARY

According to at least one example embodiment of the inventive concepts, an operating method of a storage device which includes a nonvolatile memory and a memory controller configured to control the nonvolatile memory, includes tracking a clock signal; entering a vendor mode of the storage device when the clock signal corresponds to a vendor pattern; and maintaining a normal mode of the storage device when the clock signal does not correspond to the vendor pattern, wherein, in the normal mode, a command received from an external host device is executed according to a first rule, and wherein, in the vendor mode, the command received from the external host device is executed according to a second rule different from the first rule.

The clock signal may be received through a first signal line and the command is received through a second signal line different from the first signal line.

A storage space, corresponding to an address included in the command, from among a storage space of the nonvolatile memory may be accessed in response to the command and according to the first rule.

An operation indicated by an address included in the command may be performed according to the second rule.

The address may indicate at least one of an operation of reading meta data from the nonvolatile memory and an operation of reading information on a state of the storage device.

The vendor pattern may include a pattern in which a waveform of the clock signal may include a plurality of different frequencies.

The vendor pattern may include a pattern in which duration times during which the clock signal maintains respective ones of the plurality of different frequencies are different from each other.

In the vendor pattern, duration times during which the clock signal maintains respective ones of the plurality of different frequencies may be the same.

The vendor pattern may include a pattern in which the numbers of cycles over which the clock signal maintains respective ones of the plurality of different frequencies are different from each other.

In the vendor pattern, the numbers of cycles over which the clock signal maintains respective ones of the plurality of different frequencies may be the same.

The vendor pattern may include a pattern in which a wave form of the clock signal includes a plurality of different duty ratios.

The vendor pattern may include a pattern in which duration times during which the clock signal maintains respective ones of the plurality of different duty ratios are different from each other.

In the vendor pattern, duration times during which the clock signal maintains respective ones of the plurality of difference duty ratios may be the same.

The vendor pattern may include a pattern of active and inactive intervals of the clock signal.

The tracking operation may be performed in response to a pattern in which a second signal line is driven, the second signal line being a signal line that transfers the command to the storage device.

The tracking operation may be performed in response to a pattern in which third signal lines are driven, the third signal lines being signal lines that exchange data between the external host and the storage device.

The tracking of a clock signal may be performed while a second signal line for transferring the command is driven with a specific level and third signal lines exchanging data with the external host device are respectively driven with specific levels according to a specific pattern.

The operating method may further include transferring a response signal through a command and response line through which the command is transferred, the response signal indicating that entry of the storage device into the vendor mode is completed.

According to at least one example embodiment of the inventive concepts, a storage device includes a nonvolatile memory; and a memory controller configured to control the nonvolatile memory, wherein the memory controller is configured to track a clock signal received through a first pad and to activate an entry signal when the clock signal corresponds to a vendor pattern, and wherein the storage device is configured such that, when the entry signal remains at an inactive state, a command received through a second pad is performed according to a first rule, and when the entry signal remains at an active state, the command received through the second pad is performed according to a second rule different from the first rule.

The memory controller may be further configured to inactivate the entry signal when the clock signal corresponds to a second vendor pattern.

According to at least one example embodiment of the inventive concepts, a method may include receiving, at a storage device, a clock signal, determining a pattern of the clock signal, receiving, at the storage device, a command for accessing the storage device; executing the command at the storage device according to a first rule, when the pattern of the clock signal corresponds to a first pattern; and executing the command at the storage device according to a second rule, when the pattern of the clock signal corresponds to a second pattern, the first rule and the first pattern being different than the second rule and the second pattern, respectively.

The method further comprises receiving, at the storage device, one or more tracking time initiation signals; and receiving, at the storage device, one or more tracking time ending signals. The determining is performed only during a tracking time, the tracking time beginning in response to the one or more tracking time initiation signals, the tracking time ending in response to the one or more tracking time ending signals.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 15 is a table showing embodiments of a vendor pattern indicating an entry or end of a vendor mode;

DETAILED DESCRIPTION

Figure 1:
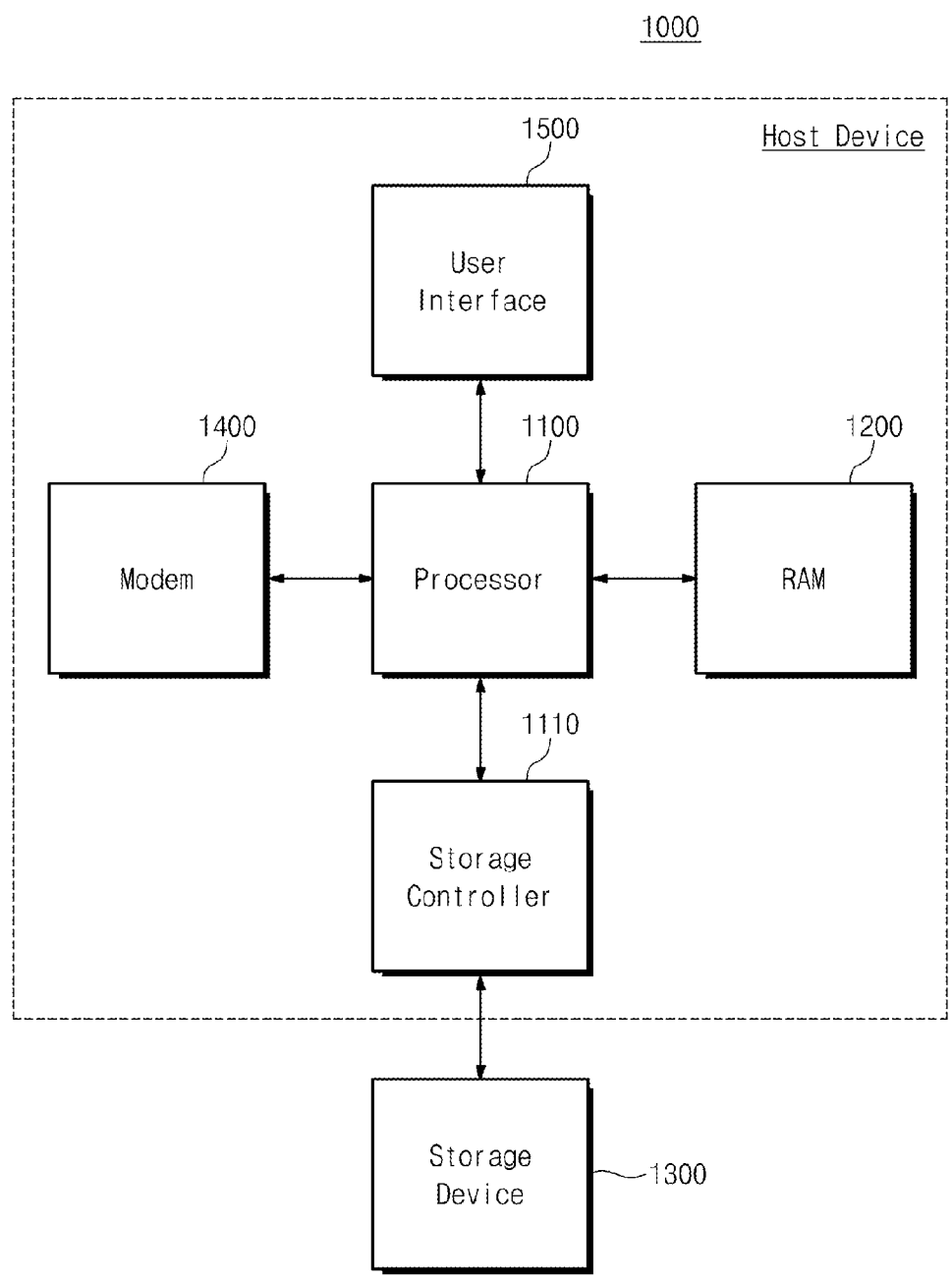
FIG. 1 is a block diagram schematically illustrating a computing device according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram schematically illustrating a computing device 1000 according to at least one example embodiment of the inventive concepts. Referring to FIG. 1, a computing device 1000 includes a processor 1100, a storage controller 1110, a random access memory (RAM) 1200, a storage device 1300, a modem 1400, and a user interface 1500.

The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multiprocessor, an application-specific integrated circuit (ASIC), and a field programmable gate array (FPGA).

The processor 1100 controls an overall operation of the computing device 1000 and performs a logical operation. The processor 1100 is formed of a system-on-chip (SoC). The processor 1100 may be, for example, an application processor.

The storage controller 1110 accesses the storage device 1300 according to a control of the processor 1100. The storage controller 1110 accesses the storage device 1300 according to a control of other components of the computing device 1000, such as the modem 1400 or the user interface 1500, as well as the processor 1100.

The RAM 1200 communicates with the processor 1100. The RAM 1200 may be a main memory of the processor 1100 or the computing device 1000. The processor 1100 stores codes or data in the RAM 1200 temporarily. The processor 1100 executes codes using the RAM 1200 to process data. The processor 1100 executes a variety of software, such as, but not limited to, an operating system and an application, by means of the RAM 1200. The processor 1100 controls an overall operation of the computing device 1000 by means of the RAM 1200. The RAM 1200 may include a volatile memory such as, but not limited to, a static RAM (SRAM), a dynamic RAM (DRAM), and a synchronous DRAM (SDRAM) or a nonvolatile memory such as, but not limited to, a Phase-change RAM (PRAM), a Magnetic RAM (MRAM), a Resistive RAM (RRAM), and a Ferroelectric RAM (FRAM).

The storage device 1300 communicates with the processor 1100. According to at least one example embodiment of the inventive concepts, the storage device 1300 may be used to store data for a relatively long time. That is, the processor 1100 may store data, which is to be stored for a relatively long time, in the storage device 1300. The storage device 1300 stores a boot image for driving the computing device 1000. The storage device 1300 stores source codes of a variety of software, such as an operating system and an application. The storage device 1300 stores data that is processed by a variety of software, such as an operating system and an application.

In at least some example embodiments of the inventive concepts, the processor 1100 loads source codes stored in the storage device 1300 on the RAM 1200 through the storage controller 1110. The codes loaded on the RAM 1200 are executed to run a variety of software, such as operating system and an application. The processor 1100 loads data stored in the storage device 1300 on the RAM 1200 and processes data loaded on the RAM 1200. The processor 1100 stores long-term data of data stored in the RAM 1200 at the storage device 1300.

The storage device 1300 includes a nonvolatile memory, such as, but not limited to, a flash memory, a PRAM (Phase-change RAM), an MRAM (Magnetic RAM), an RRAM (Resistive RAM), or an FRAM (Ferroelectric RAM).

The modem 1400 communicates with an external device according to a control of the processor 1100. For example, the modem 1400 communicates with the external device in a wire or wireless manner. The modem 1400 may communicate with the external device, based on at least one of wireless communication manners such as LTE (Long Term Evolution), WiMax, GSM (Global System for Mobile communication), CDMA (Code Division Multiple Access), Bluetooth, NFC (Near Field Communication), WiFi, and RFID (Radio Frequency Identification or wired communication manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), and eMMC (embedded MMC).

The user interface 1500 communicates with a user under a control of the processor 1100. For example, the user interface 1500 may include user input interface devices such as a keyboard, a keypad, a button, a touch panel, a touch screen, a touch pad, a touch ball, a camera, a microphone, a gyroscope sensor, and a vibration sensor. The user interface 1500 may further include user output interface devices such as an LCD, an OLED (Organic Light Emitting Diode) display device, an AMOLED (Active Matrix OLED) display device, an LED, a speaker, and a motor.

The storage device 1300 may be driven in a normal mode or a vendor mode according to a control of the processor

1100. For example, more particularly, the processor 1100 may control the storage device 1300 by controlling the storage controller 1110. In the normal mode, the computing device 1000 writes user data at the storage device 1300 and reads user data from the storage device 1300. In the vender mode, the computing device 1000 manages the storage device 1300 or a state of the storage device 1300. In the vendor mode, the computing device 1000 may manage a nonvolatile memory, a volatile memory, and/or registers included in the storage device 1300. For example, in the vendor mode, the computing device 1000 may read meta data stored at the nonvolatile memory of the storage device 1300 or may write meta data at the nonvolatile memory of the storage device 1300. In the vendor mode, the computing device 1000 performs reading or writing of the volatile memory of the storage device 1300 including, for example, a buffer memory, a cache memory, or a working memory. In the vendor mode, the computing device 1000 performs reading or writing of the registers of the storage device 1300, for example, state registers or command registers. According to at least one example embodiment of the inventive concepts, operations described herein as being performed by the computing device 1000 may be performed by, or, alternatively, under the control of, the processor 1100.

For example, the computing device 1000 reads meta data from the storage device 1300. The meta data may include one or both or information that is needed to manage the storage device 1300 and firmware that is driven on the storage device 1300. The computing device 1000 updates firmware or mapping information of the storage device 1300.

For example, the computing device 1000 manages a state of the storage device 1300. The computing device 1000 controls the storage device 1300 so as to perform a read operation for detecting states of threshold voltage distributions of memory cells of the storage device 1300. The computing device 1000 acquires information on an erase count (or, program count) of memory cells of the storage device 1300 from the storage device 1300. The computing device 1000 acquires the following information from the storage device 1300: whether an uncorrectable error UECC is detected at the storage device 1300 or the number of events that the uncorrectable error UECC is detected. The computing device 1000 acquires information on the number of bad blocks or the number of reserved blocks of the storage device 1300 from the storage device 1300. The computing device 1000 changes a setting of the storage device 1300, based on the information acquired from the storage device 1300. For example, the computing device 1000 may adjust the following schemes of the storage device 1300: program scheme, read scheme, erase scheme, and/or scheme for managing memory blocks.

Embodiments in which the computing device 1000 and the storage device 1300 enter the vendor mode will be more fully described with reference to accompanying drawings.

Figure 2:
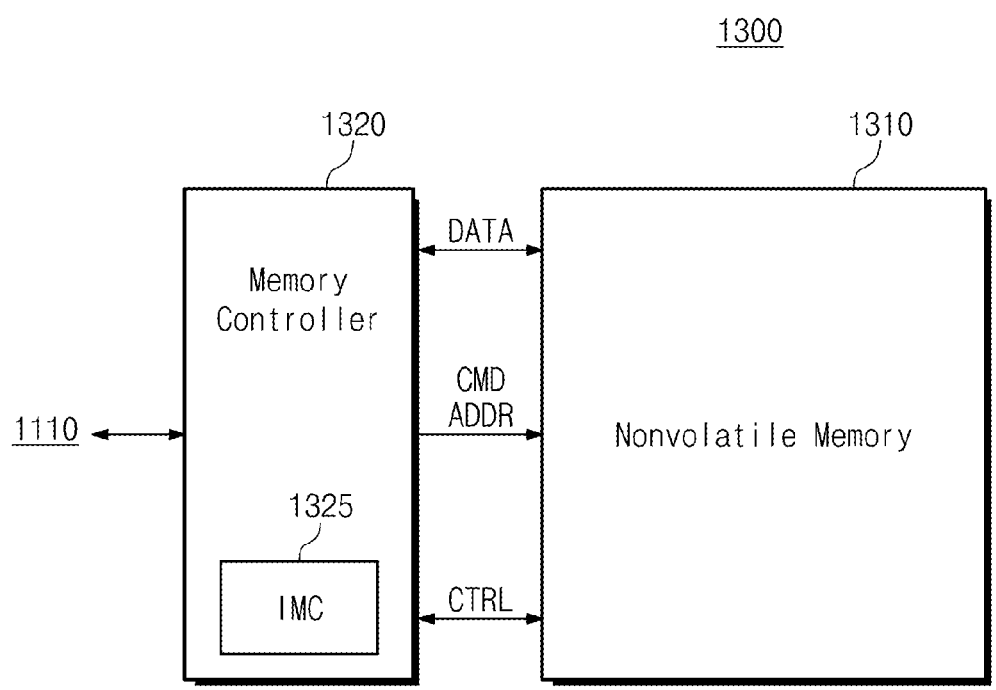
FIG. 2 is a block diagram schematically illustrating a storage device according to at least one example embodiment of the inventive concepts.

FIG. 2 is a block diagram schematically illustrating a storage device 1300 according to at least one example embodiment of the inventive concepts. Referring to FIG. 2, a storage device 1300 contains a nonvolatile memory 1310 and a memory controller 1320.

The nonvolatile memory 1320 performs read, write, and erase operations according to a control of the memory controller 1320. The nonvolatile memory 1310 exchanges data with the memory controller 1320. For example, the nonvolatile memory 1310 receives data from the memory controller 1320 and the nonvolatile memory 1310 stores the received data by writing the received data to itself. The nonvolatile memory 1310 performs a read operation by reading data stored in the nonvolatile memory 1310 and outputs the read data to the memory controller 1320.

The nonvolatile memory 1310 receives a command CMD and an address ADDR from the memory controller 1320. The nonvolatile memory 1310 exchanges a control signal CTRL with the memory controller 1320. For example, the nonvolatile memory 1310 receives, from the memory controller 1320, at least one of a chip enable signal/CE for selecting at least one of a plurality of semiconductor chips included in the nonvolatile memory 1310, a command latch enable signal CLE indicating that a signal received from the memory controller 1320 is a command CMD, an address latch enable signal ALE indicating that a signal received from the memory controller 1320 is an address ADDR, a read enable signal/RE that the memory controller 1320 generates at a read operation, is periodically toggled, and is used to tune timing, a write enable signal/WE activated by the memory controller 1320 when the command CMD or the address ADDR is transmitted, a write protection signal/WP activated by the memory controller 1320 to prevent unintended writing or erasing when a power changes, and a data strobe signal DQS that the memory controller 1320 generates a write operation, is periodically toggled, and is used to adjust input synchronization of data. For example, the nonvolatile memory 1310 outputs, to the memory controller 1320, at least one of a ready/busy signal R/nB indicating whether the nonvolatile memory 1310 is performing a program, erase or read operation and a data strobe signal DQS that the nonvolatile memory 1310 generates based on the read enable signal /RE, is periodically toggled, and is used to adjust output synchronization of data.

The nonvolatile memory 1310 may include a flash memory. However, the scope and spirit of at least some example embodiments of the inventive concepts may not be limited thereto. For example, the nonvolatile memory 1310 may incorporate at least one of nonvolatile memories, examples of which include, but are not limited to, PRAM (Phase-change RAM), MRAM (Magnetic RAM), RRAM (Resistive RAM), and FeRAM (Ferroelectric RAM).

The memory controller 1320 controls the nonvolatile memory 1310. For example, the nonvolatile memory 1310 performs a write, read, or erase operation according to a control of the memory controller 1320. The memory controller 1320 exchanges data and a control signal CTRL with the nonvolatile memory 1310. The memory controller 1320 outputs a command CMD and an address ADDR to the nonvolatile memory 1310. The memory controller 1320 controls the nonvolatile memory 1310 according to a control of an external host device.

The memory controller 1320 contains an interface and mode detection circuit (IMC) 1325. The interface and mode detection circuit 1325 exchanges signals with a host device. The interface and mode detection circuit 1325 determines whether a vendor mode is requested, based on the signals received from the host device. The memory controller 1320 operates in the vendor mode as a consequence of determining that the vendor mode is requested. The memory controller 1320 operates in the normal mode when the vendor mode is not requested or the vendor mode ends. Accordingly, the normal mode is an operation mode of the memory controller 1320 that is not the vendor mode.

The storage device 1300 performs an operation of writing, reading or erasing data according to a request from the host device. The storage device 1300 may include a solid state drive (SSD) or a hard disk drive (HDD). The storage device 1300 may include memory cards, such as PC card (PCM- CIA, personal computer memory card international association), compact flash card, smart media card (SM, SMC), memory stick, multimedia card (MMC, RS-MMC, MMC-micro), SD card (SD, miniSD, microSD, SDHC), USB (Universal Serial Bus) memory card, and universal flash storage (UFS). The storage device 1300 may include embedded memories, such as eMMC (embedded MultiMedia Card), managed NAND, error-free NAND, UFS, and PPN (Perfect Page New).

In at least some example embodiments of the inventive concepts, the memory controller 1320 may further include a RAM that is used as a working memory, a buffer memory, or a cache memory. For example, the memory controller 1320 receives data from the host device and stores the received data at the RAM. The memory controller 1320 writes data stored in the RAM at the nonvolatile memory 1310. The memory controller 1320 reads data from the nonvolatile memory 1310 and stores the data thus read in the RAM. The memory controller 1320 outputs data stored in the RAM to the host device. The memory controller 1320 stores data read from the nonvolatile memory 1310 at the RAM and writes the data stored in the RAM back at the nonvolatile memory 1310.

The memory controller 1320 stores data or code, which is needed to manage the nonvolatile memory 1310, at the RAM. For example, the memory controller 1320 reads data or code, which is needed to manage the nonvolatile memory 1310, from the nonvolatile memory 1310 and loads the read data or code on the RAM for driving.

The RAM may include one or more of a variety of random access memories, examples of which include, but are not limited to, a static RAM, a dynamic RAM, a synchronous DRAM (SRAM), a Phase-change RAM (PRAM), a Magnetic RAM (MRAM), a Resistive RAM (RRAM), and a Ferroelectric RAM (FRAM).

Figure 3:
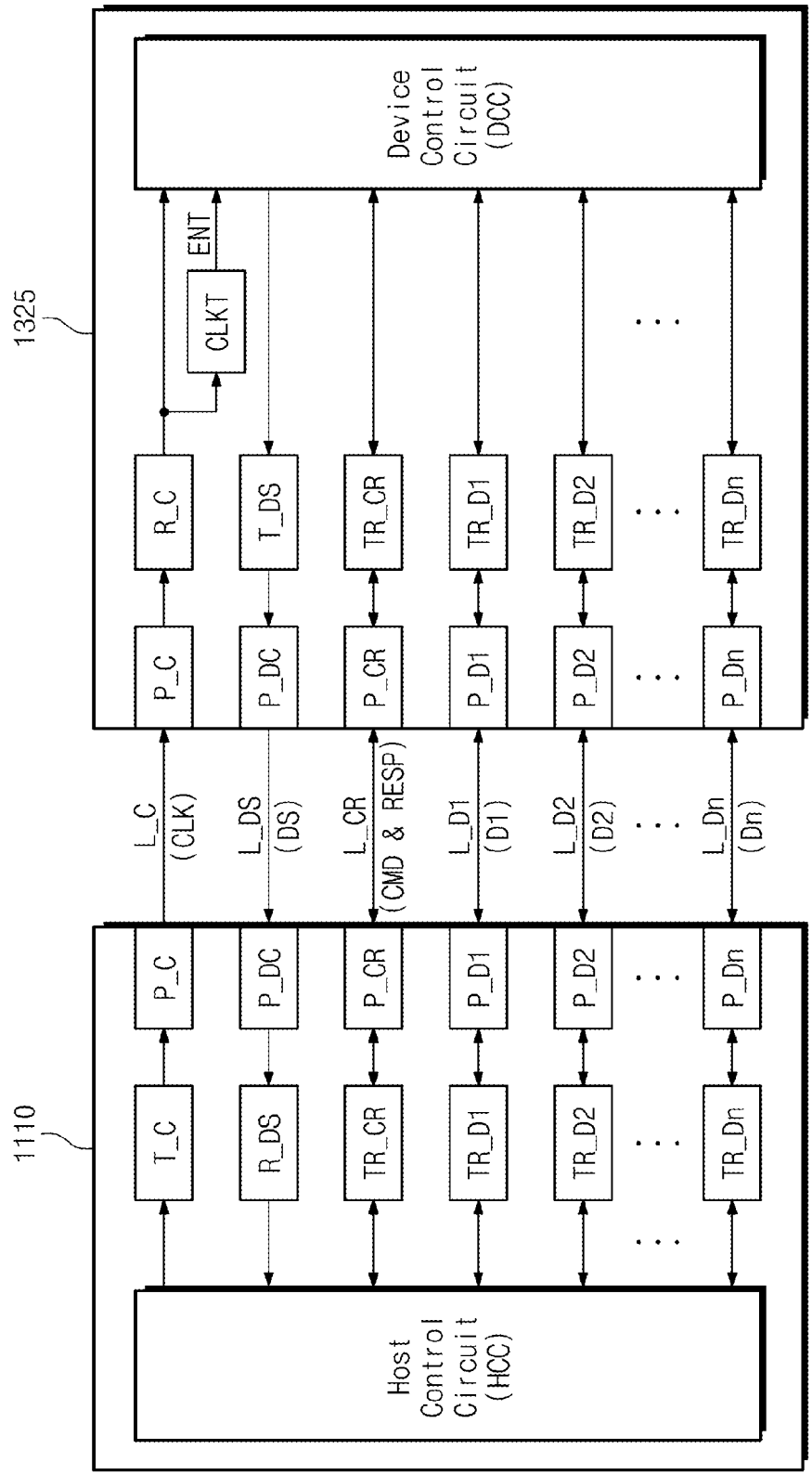
FIG. 3 is a block diagram schematically illustrating an interface and mode detection circuit shown in FIG. 2 and a storage controller shown in FIG. 1.

FIG. 3 is a block diagram schematically illustrating an interface and mode detection circuit 1325 shown in FIG. 2 and a storage controller 1110 shown in FIG. 1. Referring to FIG. 3, a storage controller 1110 contains a host control circuit HCC, a clock signal transmitter T_C, a clock signal pad P_C, a data strobe signal receiver R_DS, a data strobe signal pad P_DS, a command and response transceiver TR_CR, a command and response pad P_CR, first through n-th data transceivers TR_D1 through TR_Dn, and first through n-th data pads P_D1 through P_Dn.

The clock signal transmitter T_C outputs a clock signal CLK through the clock signal pad P_C according to a control of the host control circuit HCC. The clock signal CLK is transferred to a clock signal line L_C from the clock signal pad PC.

The data strobe signal receiver R_DS receives a data strobe signal DS from the data strobe signal pad P_DS according to a control of the host control circuit HCC. The data strobe signal DS is received at the data strobe signal pad P_DS through a data strobe signal line L_DS.

The command and response transceiver TR_CR outputs a command CMD through the command and response pad P_CR according to a control of the host control circuit HCC and receives a response RESP from the command and response pad P_CR. The command CMD is transferred to a command and response line L_CR from the command and response pad P_CR. The response RESP is received at the command and response pad P_CR through the command and response line L_CR.

The first through n-th data transceivers TR_D1 through TR_Dn are connected to first through n-th data pads P_D1 through P_Dn, respectively. The first through n-th data transceivers TR_D1 through TR_Dn output first through n-th data D1 through Dn through first through n-th data pads P_D1 through P_Dn. The first through n-th data transceivers TR_D1 through TR_Dn receives first through n-th data D1 through Dn from the first through n-th data pads P_D1 through P_Dn. The first through n-th data D1 through Dn are transferred to first through n-th data lines L_D1 through L_Dn from the first through n-th data pad P_D1 through P_Dn.

An interface and mode detection circuit 1325 contains a device control circuit DCC, a clock signal receiver R_C, a clock signal pad P_C, a data strobe signal transmitter T_DS, a data strobe signal pad P_DS, a command and response transceiver TR_CR, a command and response pad P_CR, first through n-th data transceivers TR_D1 through TR_Dn, first through n-th data pads P_D1 through P_Dn, and a clock signal tracker CLKT.

The clock signal receiver R_C receives the clock signal CLK through the clock signal pad P_C according to a control of the device control circuit DCC. The clock signal CLK is received at the clock signal pad P_C from the clock signal line L_C.

The clock signal tracker CLKT receives the clock signal CLK from the clock signal receiver R_C. The clock signal tracker CLKT determines whether the clock signal CLK corresponds to a predetermined vender pattern. For example, the clock signal tracker CLKT may compare the clock signal CLK with a vendor pattern stored at a register (not shown).

According to at least one example embodiment of the inventive concepts, when a pattern of the clock signal CLK or a pattern in which a characteristic of the clock signal CLK is varied is identical to a first vendor pattern stored at the register, the clock signal tracker CLKT activates an entry signal ENT. Alternatively, when a degree of similarity (e.g., between (i) a pattern of the clock signal CLK or a pattern in which a characteristic of the clock signal CLK is varied and (ii) a first vendor pattern stored at the register), is within a reference range, the clock signal tracker CLKT activates an entry signal ENT. The reference range may be set in accordance with the preferences of a manufacturer and/or user of the storage device 1300.

According to at least one example embodiment of the inventive concepts, when, when a pattern of the clock signal CLK or a pattern in which a characteristic of the clock signal CLK is varied is identical to a second vendor pattern stored at the register, the clock signal tracker CLKT inactivates the entry signal ENT. Alternatively, when a degree of similarity (e.g., between (i) a pattern of the clock signal CLK or a pattern in which a characteristic of the clock signal CLK is varied and (ii) a second vendor pattern stored at the register) is within a reference range, the clock signal tracker CLKT inactivates the entry signal ENT. The reference range may be set in accordance with the preferences of a manufacturer and/or user of the storage device 1300.

In at least some example embodiments of the inventive concepts, the register for storing information on the vendor patterns may be implemented in the clock signal tracker CLKT, in the device control circuit DCC, or at any other places. The register may be configured to be programmed by the host device, for example.

The data strobe signal transmitter T_DS outputs a data strobe signal DS to the data strobe signal pad P_DS according to a control of the device control circuit DCC. The data strobe signal DS is transferred to the data strobe signal line L_DS from the data strobe signal pad P_DS.

The command and response transceiver TR_CR receives a command CMD from the command and response pad P_CR according to a control of the device control circuit DCC and outputs a response RESP through the command and response pad P_CR. The command CMD is received at the command and response pad P_CR from the command and response line L_CR. The response RESP is transferred to the command and line L_CR from the command and response pad P_CR.

The first through n-th data transceivers TR_D1 through TR_Dn are connected to first through n-th data pads P_D1 through P_Dn, respectively. The first through n-th data transceivers TR_D1 through TR_Dn output first through n-th data D1 through Dn through first through n-th data pads P_D1 through P_Dn. The first through n-th data transceivers TR_D1 through TR_Dn receive first through n-th data D1 through Dn from the first through n-th data pads P_D1 through P_Dn. The first through n-th data D1 through Dn are transferred to first through n-th data lines L_D1 through L_Dn from the first through n-th data pad P_D1 through P_Dn. The first through n-th data D1 through Dn are received at the first through n-th data pads P_D1 through P_Dn from the first through n-th data lines L_D1 through L_Dn.

The clock signal pad P_C of the storage controller 1110 and the clock signal pad P_C of the interface and mode detection circuit 1325 are connected to each other through the clock signal line L_C. The data strobe signal pad P_DS of the storage controller 1110 and the data strobe signal pad P_DS of the interface and mode detection circuit 1325 are connected to each other through the data strobe signal line L_DS. The command and response pad P_CR of the storage controller 1110 and the command and response pad P_CR of the interface and mode detection circuit 1325 are connected to each other through the command and response line L_CR. The data pads P_D1 through P_Dn of the storage controller 1110 and the data pads P_D1 through P_Dn of the interface and mode detection circuit 1325 are connected to each other through the data line L_D1 through L_Dn respectively.

Figure 4:
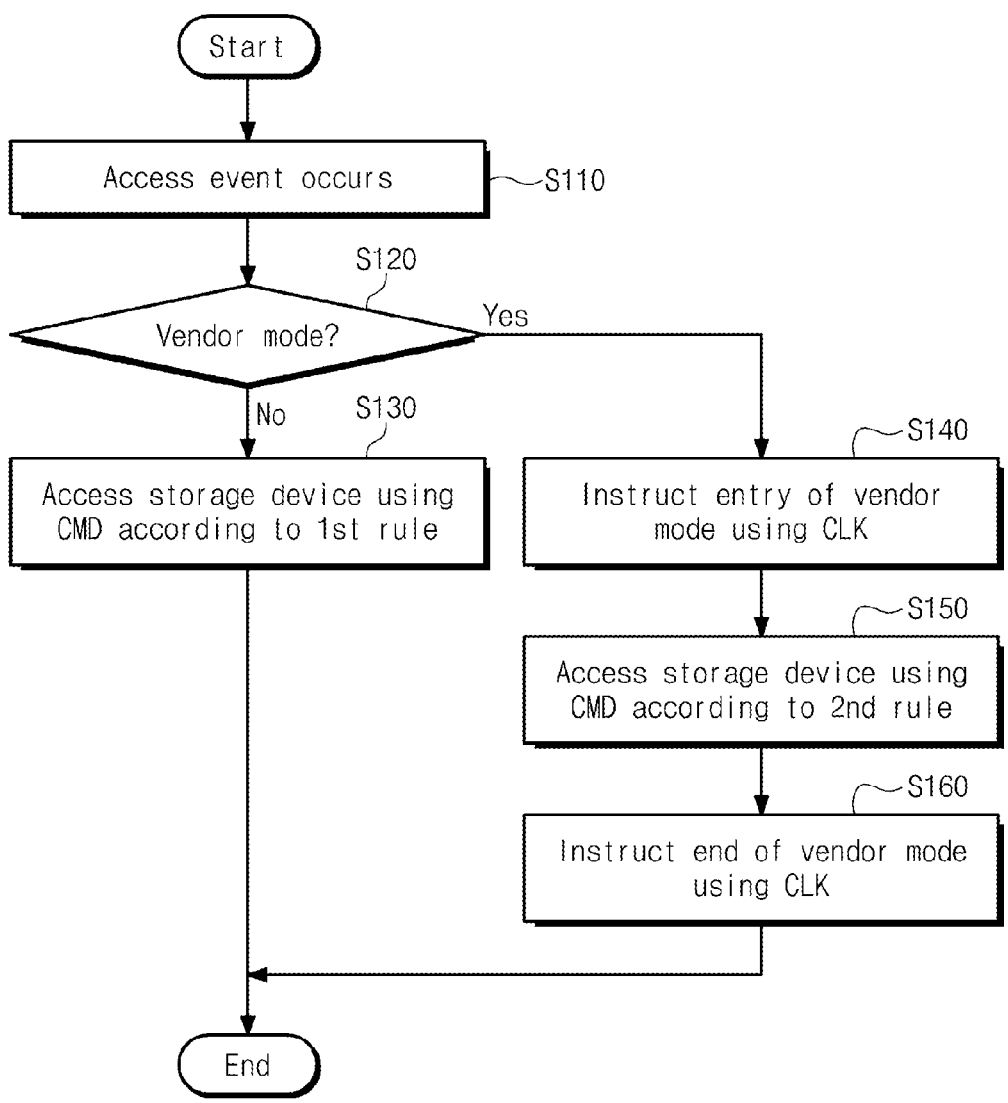
FIG. 4 is a flow chart showing a control method of a storage device according to at least one example embodiment of the inventive concepts.

FIG. 4 is a flow chart showing a control method of a storage device 1300 according to at least one example embodiment of the inventive concepts. FIG. 4 illustrates an example of a method in which a host device controls a storage device 1300 under a condition where the host device and the storage device 1300 are initialized and then operate normally. Referring to FIGS. 1 and 4, in step S110, an access event of a storage device 1300 occurs. For example, software that is driven on a host device may issue a request requesting an access to the storage device 1300.

When the access request on the storage device 130 is a request indicating a normal mode (and not a vendor mode) (S120), in step S130, the host device accesses the storage device 1300 using a command CMD that is based on a first rule. For example, the host device may generate a command CMD that includes an address that points out a storage space of the storage device 1300 to be accessed. The host device provides the generated command CMD to the storage device 1300.

When the access request on the storage device 130 is a request indicating the vendor mode (and not the normal mode) (S120), in step S140, the host device instructs the storage device 1300 on an entry of the vendor mode using a clock signal CLK. For example, the host device instructs the storage device 1300 to enter the vendor mode by changing the clock signal CLK or a characteristic of the clock signal CLK according to a first vendor pattern.

In step S150, the host device accesses the storage device 1300 using a command CMD that is based on a second rule. For example, the host device may generate a command that includes an address pointing out a vendor operation or a vendor function of vendor mode the storage device 1300 supports. The host device provides the generated command CMD to the storage device 1300. The host device may request the vendor operation or the vendor function of the vendor mode by providing the generated command to the storage device 1300. Further, According to at least one example embodiment of the inventive concepts, the host device may request two or more vendor operations or vendor functions of the vendor mode by providing two or more commands to the storage device 1300.

If the access event associated with the vendor mode ends, in step S160, the host device indicates to the storage device 1300 that the vendor mode has ended using the clock signal CLK. For example, the host device instructs the storage device 1300 to end the vendor mode by changing the clock signal CLK or a characteristic of the clock signal CLK according to a second vendor pattern.

In at least some example embodiments of the inventive concepts, the first vendor pattern may be the same as or different from the second vendor pattern.

Figure 5:
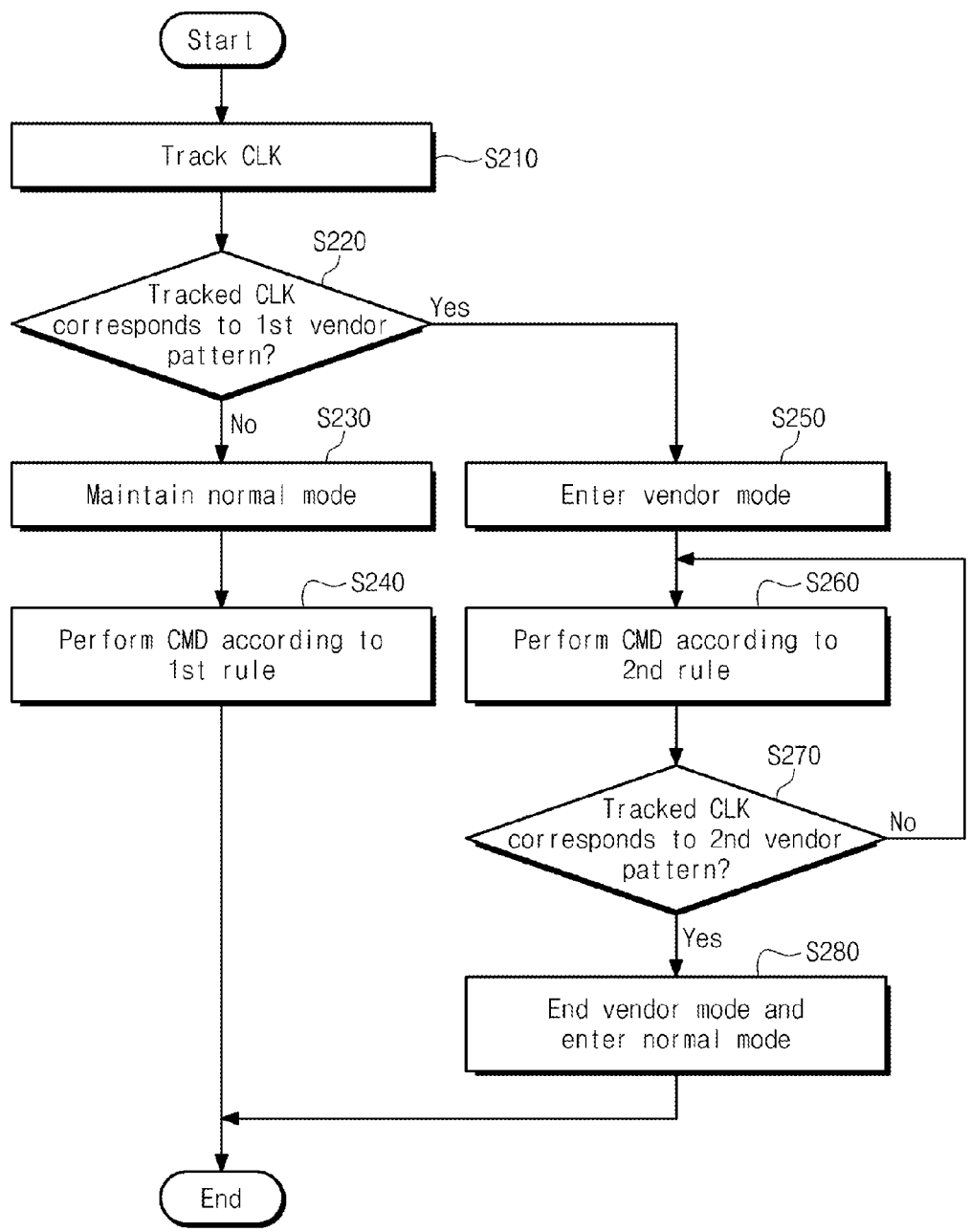
FIG. 5 is a flow chart showing an operating method of a storage device according to at least one other example embodiment of the inventive concepts.

FIG. 5 is a flow chart showing an operating method of a storage device 1300 according to at least one other example embodiment of the inventive concepts. FIG. 5 illustrates an example of a method in which a storage device 1300 decides a mode according to a clock signal CLK from a host device under a condition where the host device and the storage device 1300 are initialized and then operate normally. According to at least one example embodiment of the inventive concepts, the normal mode (and not the vendor mode) may be a default operation mode of the storage device 1300. Referring to FIGS. 1 through 3 and 5, in step S210, the storage device 1300 tracks a clock signal CLK. For example, a clock signal tracker CLKT of the storage device 1300 may track the clock signal CLK without time restriction. The clock signal tracker CLKT may track the clock signal CLK during a time that is defined by a signal received from the host device. The clock signal tracker CLKT starts to track the clock signal CLK in response to a first signal from the host device. The clock signal tracker CLKT stops tracking the clock signal CLK in response to a second signal from the host device or stops tracking the clock signal CLK after a predetermined time passes.

In step S220, the storage device 1300 determines whether the tracked clock signal CLK corresponds to a first vendor pattern. For example, the clock signal tracker CLKT may determine whether the clock signal CLK or a characteristic of the clock signal CLK varies with the first vendor pattern.

When the clock signal CLK or a characteristic of the clock signal CLK does not vary with the first vendor pattern, the tracked clock signal CLK is determined as not corresponding to the first vendor pattern. In step S230, the storage device 1300 maintains a normal mode or does not enter a vendor mode. In step S240, the storage device 1300 performs a command CMD received through the command pad P_CR according to a first rule. For example, the storage device 1300 may perform an operation (e.g., reading, writing, or erasing) corresponding to the command CMD with respect to a storage space of a nonvolatile memory 1310 that an address included in the command CMD points out.

When the clock signal CLK or a characteristic of the clock signal CLK matches or, alternatively, substantially matches the first vendor pattern, the tracked clock signal CLK is determined as corresponding to the first vendor pattern. In step S250, the storage device 1300 enters the vendor mode. In step S260, the storage device 1300 performs a command CMD received through the command pad P_CR according to a second rule. For example, the storage device may perform a vendor operation, which is identified by an address included in the command CMD, from among vendor operations supported in the vendor mode.

For example, the storage device 1300 may selectively perform at least one of the following operations according to an address value: outputting information on a version of a firmware driven on a memory controller 1320, outputting all or a part of codes of a firmware driven on the memory controller 1320, updating all or a part of codes of a firmware driven on the memory controller 1320, reading memory cells of a nonvolatile memory 1310 to determine states of threshold voltage distributions of the memory cells and outputting information on the states of the threshold voltage distributions, outputting information on an erase count or an average erase count on specific memory cells of the nonvolatile memory 1310, outputting information on the number of events that an uncorrectable error UECC is detected upon reading data, outputting information on the number of bad blocks generated in the nonvolatile memory 1310, outputting information on the number of reserved blocks of the nonvolatile memory 1310, changing a read, erase, or write scheme of the nonvolatile memory 1310 and/or a scheme for managing memory blocks, outputting information on power consumption (e.g., power consumption of the storage device 1300), and/or outputting information on a power-saving mode (e.g., a power-saving mode of the storage device 1300).

In step S270, the storage device 1300 determines whether the tracked clock signal CLK corresponds to a second vendor pattern. For example, as described in step S210, the clock signal tracker CLKT of the storage device 1300 tracks the clock signal CLK without time restriction. After entering the vendor mode, the clock signal tracker CLKT tracks the clock signal CLK during a time that is defined by a signal from the host device. After entering the vendor mode, the clock signal tracker CLKT starts to track the clock signal CLK in response to a first signal from the host device, and/or it stops tracking the clock signal CLK in response to a second signal from the host device or after a predetermined or, alternatively, desired amount of time passes, for example, from the point in time when the storage device 1300 entered the vendor mode.

When the tracked clock signal CLK does not correspond to the second vendor pattern, the method proceeds to step S260. When the tracked clock signal CLK corresponds to the second vendor pattern, the storage device 1300 ends the vendor mode and enters a normal mode. Afterwards, according to at least one example embodiment of the inventive concepts, the storage device 1300 may perform a command CMD according to the first rule, as described in step S240.

In FIG. 5, at least one example embodiment of the inventive concepts is described in which the vendor mode ends when the clock signal CLK corresponds to the second vendor pattern. However, the scope and spirit of at least some example embodiments of the inventive concepts may not be limited thereto. For example, when a predetermined time passes after entering the vendor mode, the storage device 1300 may exit from the vendor mode without a control of the host device and may send a response RESP, indicating that the vendor mode ends, to the host device.

Figure 6:
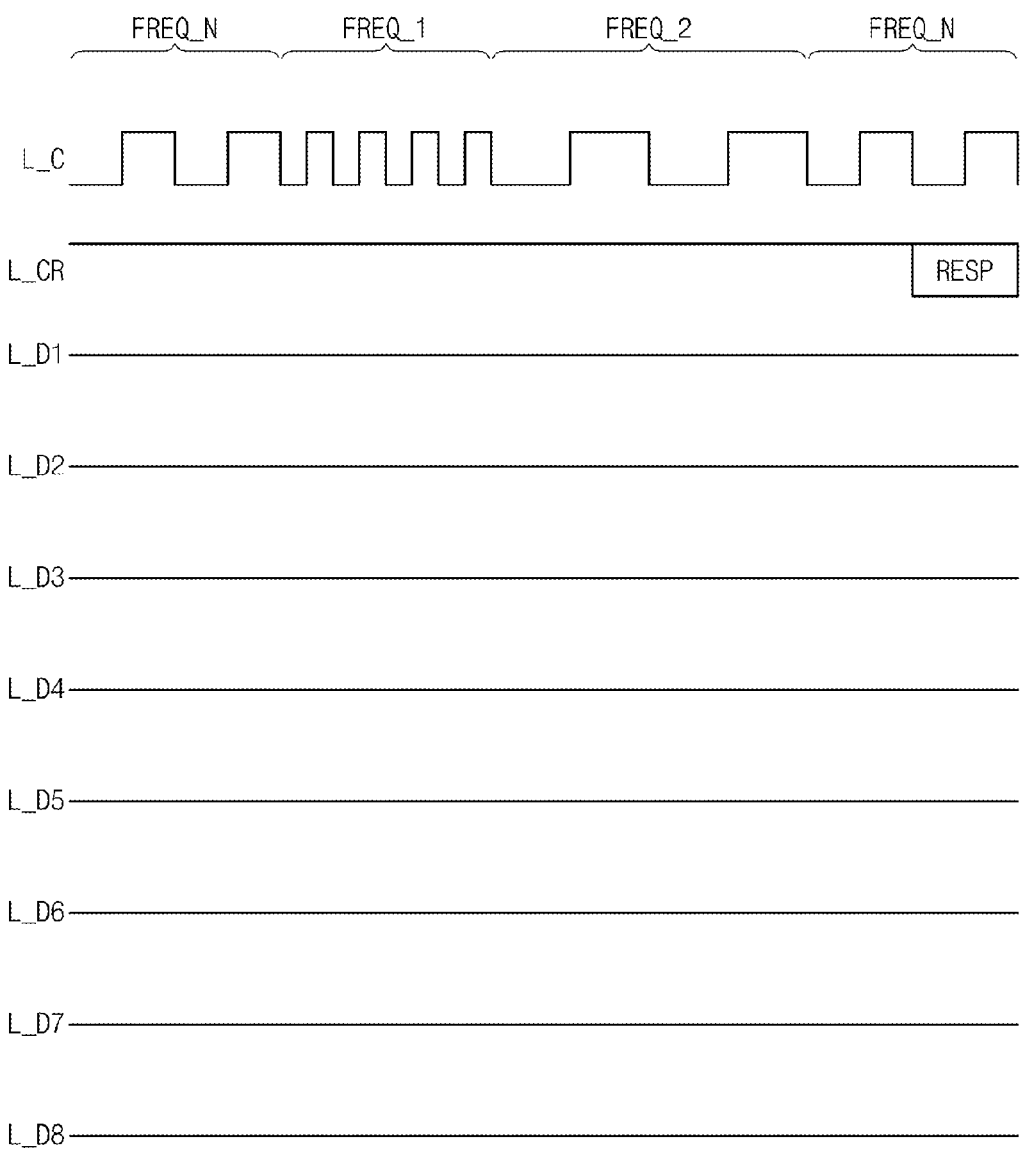
FIGS. 6 through 14 are timing diagrams showing a variation of a clock signal with a vendor pattern, according to at least some example embodiments of the inventive concepts.

FIG. 6 is a timing diagram showing a variation of a clock signal with a vendor pattern, according to at least a first example embodiment of the inventive concepts. Referring to FIGS. 1 through 3 and 6, signals that are exchanged between a storage controller 1110 and an interface and mode detection circuit 1325 through a clock signal line L_C, a command and response line L_CR, and first through eighth data lines L_D1 through L_D8 vary with the lapse of time.

At the beginning, a clock signal CLK transferred through the clock signal line L_C has a normal frequency FREQ_N. For example, the normal frequency FREQ_N may be a frequency corresponding to a communication mode that is selected by a host device and a storage device 1300. When entering a vendor mode or exiting from the vendor mode, the host device changes a frequency of the clock signal CLK according to a vendor pattern. For example, the host device changes a frequency of the clock signal CLK into a first frequency FREQ_1 and then into a second frequency FREQ_2. Afterwards, the host device restores a frequency of the clock signal CLK to the normal frequency FREQ_N.

The storage device 1300 enters or exits from the vendor mode when a frequency of the clock signal CLK is changed to the first frequency FREQ_1 and the second frequency FREQ_2. Entering the vendor mode, the storage device 1300 sends a response RESP, informing the entering of the vendor mode, to the host device through the command and response line L_CR. Exiting from vendor mode, the storage device 1300 sends a response RESP, informing that the vendor mode ends, to the host device through the command and response line L_CR.

The number of events that a frequency of the clock signal CLK varies with the vendor pattern may not be restricted. Further, the durations of the times during which the clock signal CLK has different frequencies according to the vendor pattern (e.g., FREQ_1 or FREQ_2), respectively, may be different from or equal to each other. The number of cycles where the clock signal CLK has respective frequency is iterated is not restricted. Further, the clock signal CLK maintain the different frequencies according to the vendor pattern (e.g., FREQ_1 or FREQ_2) for respective numbers of cycles (e.g., the number of events that a period of the clock signal CLK is iterated) that are the same as each other or, alternatively, different from one another.

Figure 7:
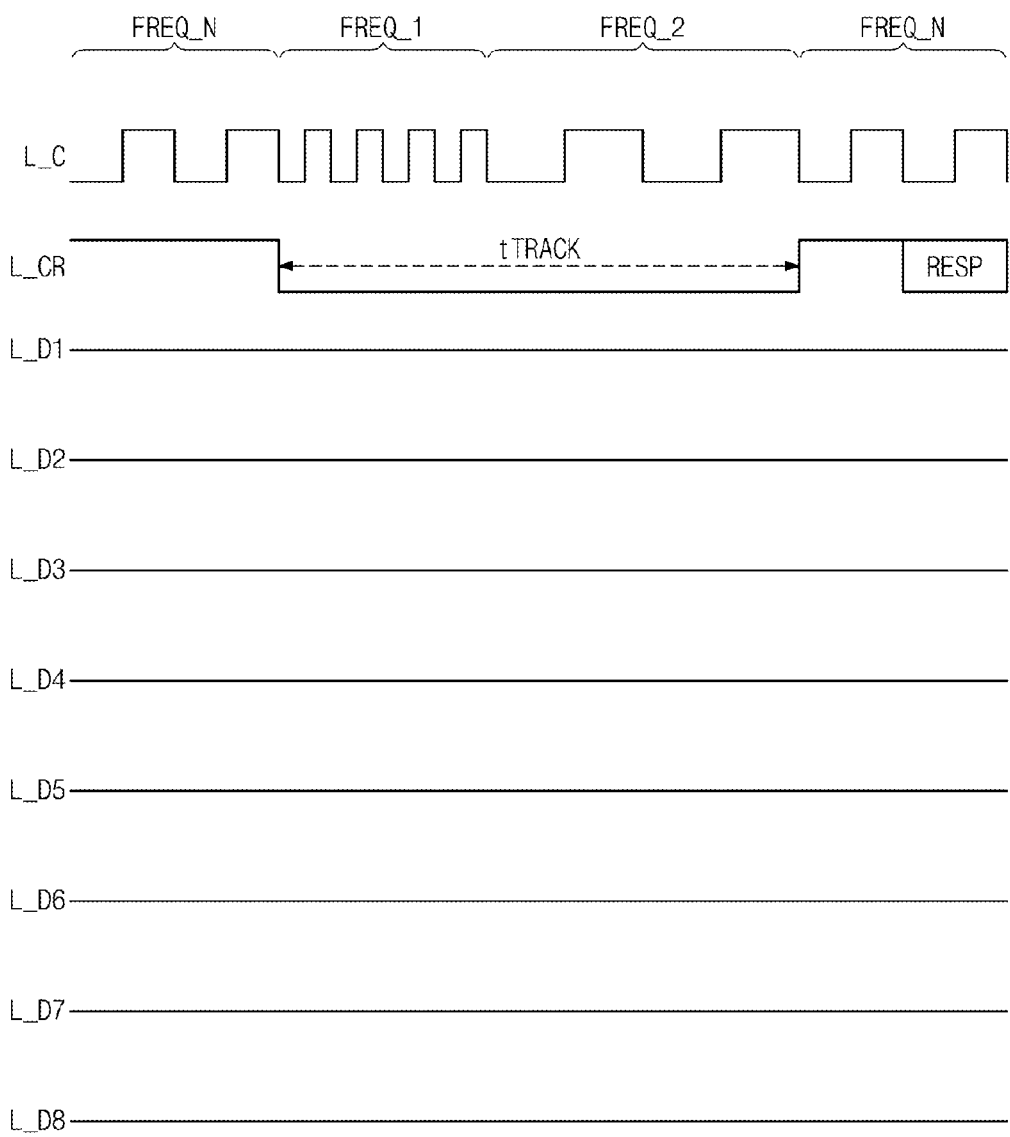

FIG. 7 is a timing diagram showing a variation (e.g., change in level) of a clock signal with a vendor pattern, according to at least a second example embodiment of the inventive concepts. Referring to FIGS. 1 through 3 and 7, signals that are exchanged between a storage controller 1110 and an interface and mode detection circuit 1325 through a clock signal line L_C, a command and response line L_CR, and first through eighth data lines L_D1 through L_D8 vary (e.g., change level) with the lapse of time.

As compared with a timing diagram shown in FIG. 6, when changing a frequency of a clock signal CLK to be transferred through the clock signal line L_C according to a vendor pattern, the host device drives the command and response line L_CR with a specific level (e.g., logical low). A clock signal tracker CLKT of a storage device 1300 tracks the clock signal CLK only if the command and response line L_CR is driven with the specific level. That is, a tracking time tTRACK when the clock signal CLK is tracked may be defined according to a level of the command and response line L_CR.

Figure 8:
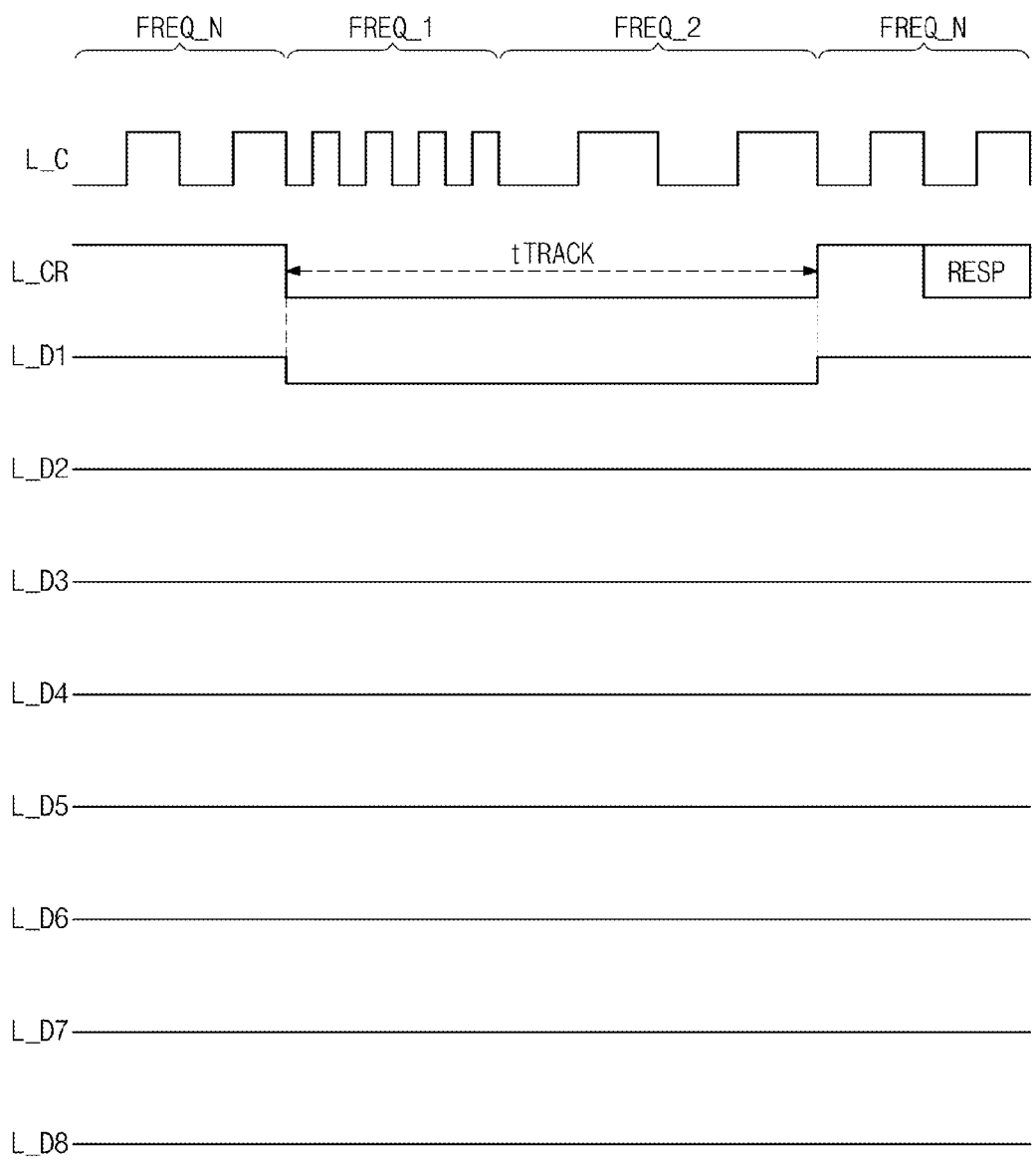

FIG. 8 is a timing diagram showing a variation (e.g., change in level) of a clock signal with a vendor pattern, according to at least a third example embodiment of the inventive concepts. Referring to FIGS. 1 through 3 and 8, signals that are exchanged between a storage controller 1110 and an interface and mode detection circuit 1325 through a clock signal line L_C, a command and response line L_CR, and first through eighth data lines L_D1 through L_D8 vary with the lapse of time.

As compared with a timing diagram shown in FIG. 6, when changing a frequency of a clock signal CLK to be transferred through the clock signal line L_C according to a vendor pattern, the host device drives the command and response line L_CR with a first level (e.g., logical low) and one (e.g., D1) of the first through eighth data lines L_D1 through L_D8 with a second level (e.g., logical low). A clock signal tracker CLKT of a storage device 1300 tracks the clock signal CLK only if the command and response line L_CR is driven with the first level and one data line (e.g., D1) is driven with the second level. That is, a tracking time tTRACK when the clock signal CLK is tracked may be defined according to a level of the command and response line L_CR and a level of one data line (e.g., D1).

Figure 9:
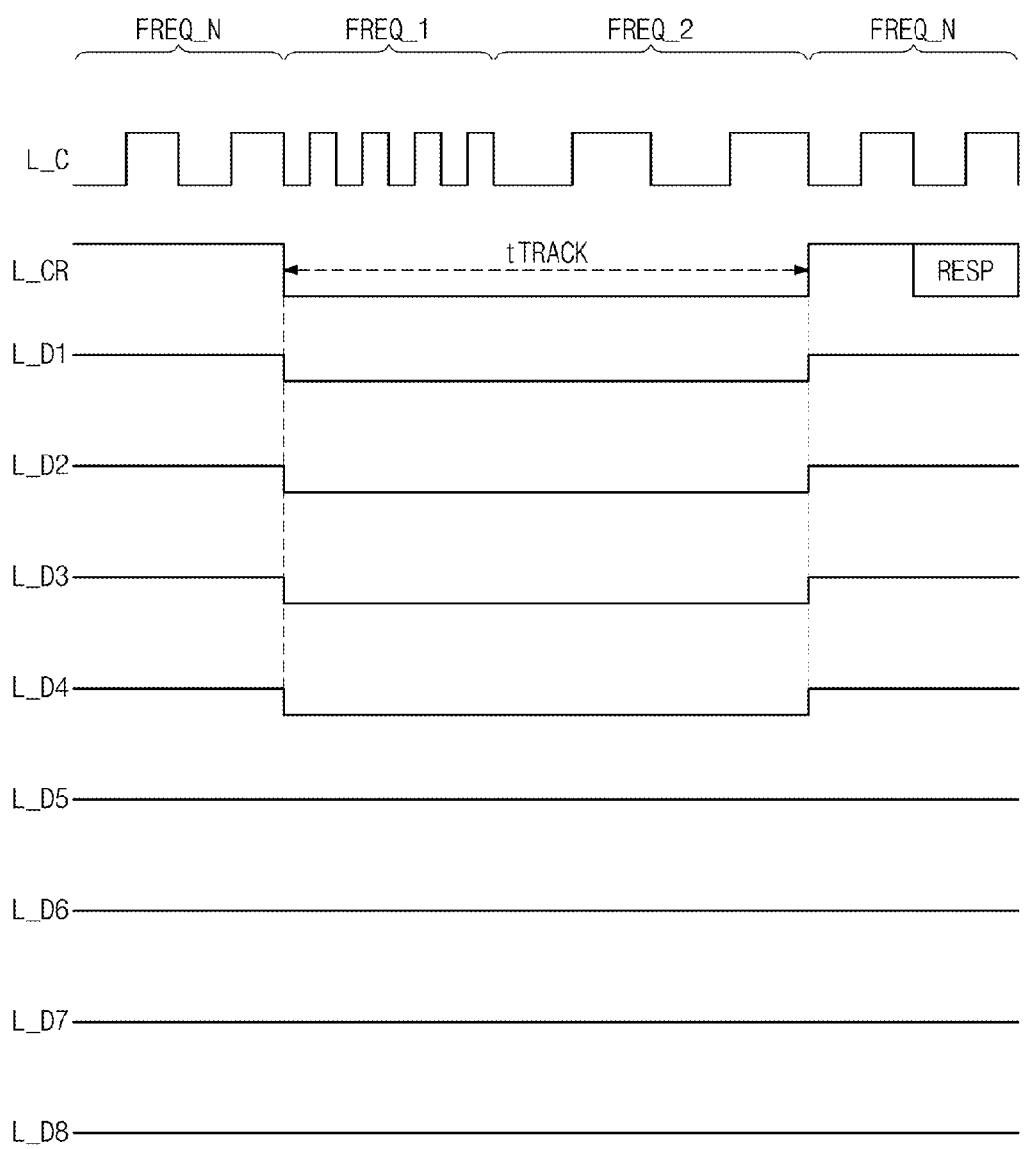

FIG. 9 is a timing diagram showing a variation (e.g., change in level) of a clock signal with a vendor pattern, according to at least a fourth example embodiment of the inventive concepts. Referring to FIGS. 1 through 3 and 9, signals that are exchanged between a storage controller 1110 and an interface and mode detection circuit 1325 through a clock signal line L_C, a command and response line L_CR, and first through eighth data lines L_D1 through L_D8 vary with the lapse of time.

As compared with a timing diagram shown in FIG. 6, when changing a frequency of a clock signal CLK to be transferred through the clock signal line L_C according to a vendor pattern, the host device drives the command and response line L_CR with a first level (e.g., logical low) and half (e.g., D1 through D4) of the first through eighth data lines L_D1 through L_D8 with a second level (e.g., logical low). A clock signal tracker CLKT of a storage device 1300 tracks the clock signal CLK only if the command and response line L_CR is driven with the first level and half (e.g., D1 through D4) of the first through eighth data lines L_D1 through L_D8 are driven with the second level. That is, a tracking time tTRACK when the clock signal CLK is tracked may be defined according to a level of the command and response line L_CR and levels of a part of data lines (e.g., D1 through D4).

Figure 10:
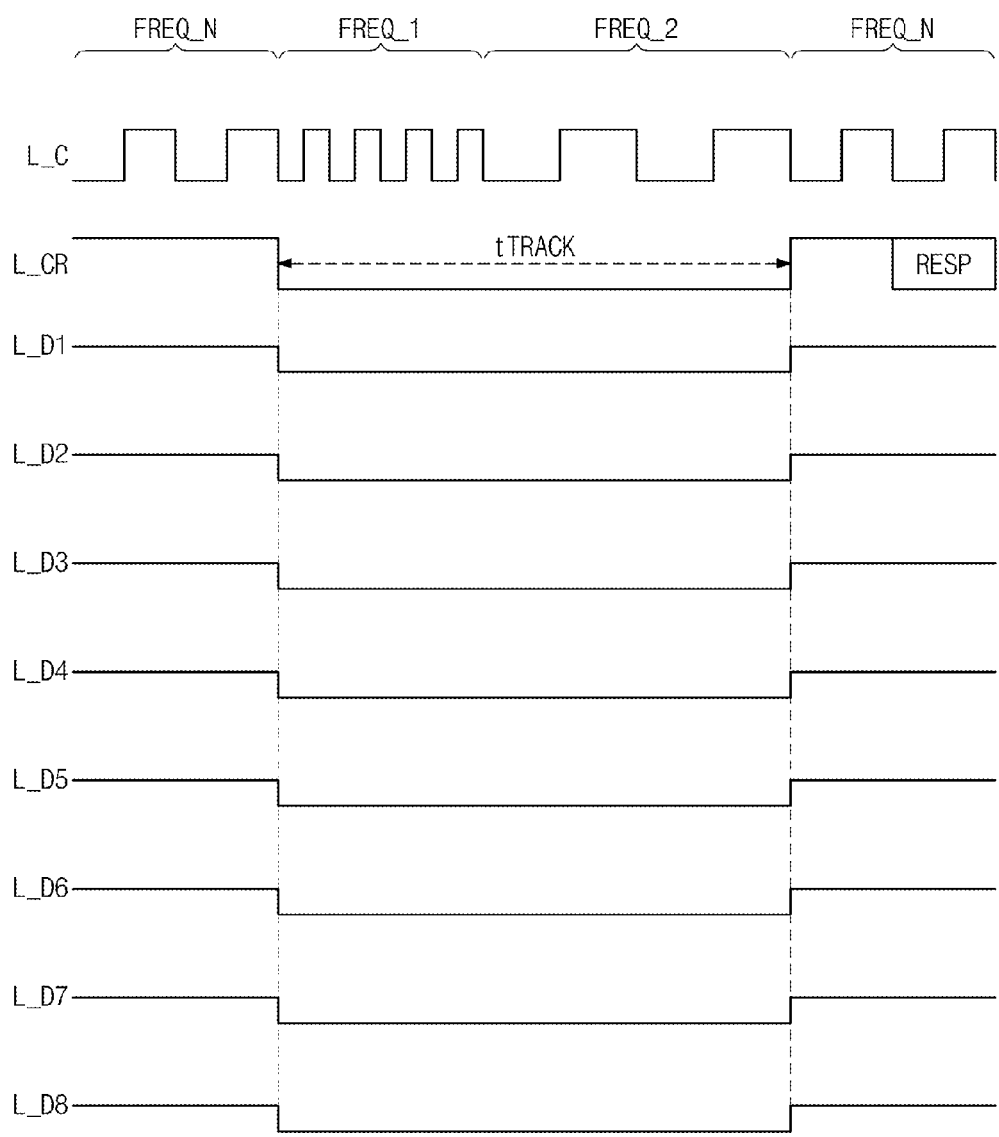

FIG. 10 is a timing diagram showing a variation (e.g., change in level) of a clock signal with a vendor pattern, according to at least a fifth example embodiment of the inventive concepts. Referring to FIGS. 1 through 3 and 10, signals that are exchanged between a storage controller 1110 and an interface and mode detection circuit 1325 through a clock signal line L_C, a command and response line L_CR, and first through eighth data lines L_D1 through L_D8 vary with the lapse of time.

As compared with a timing diagram shown in FIG. 6, when changing a frequency of a clock signal CLK to be transferred through the clock signal line L_C according to a vendor pattern, the host device drives the command and response line L_CR with a first level (e.g., logical low) and the first through eighth data lines L_D1 through L_D8 with a second level (e.g., logical low). A clock signal tracker CLKT of a storage device 1300 tracks the clock signal CLK only if the command and response line L_CR is driven with the first level and the first through eighth data lines L_D1 through L_D8 are driven with the second level. That is, a tracking time tTRACK when the clock signal CLK is tracked may be defined according to a level of the command and response line L_CR and levels of the first through eighth data lines L_D1 through L_D8.

Figure 11:
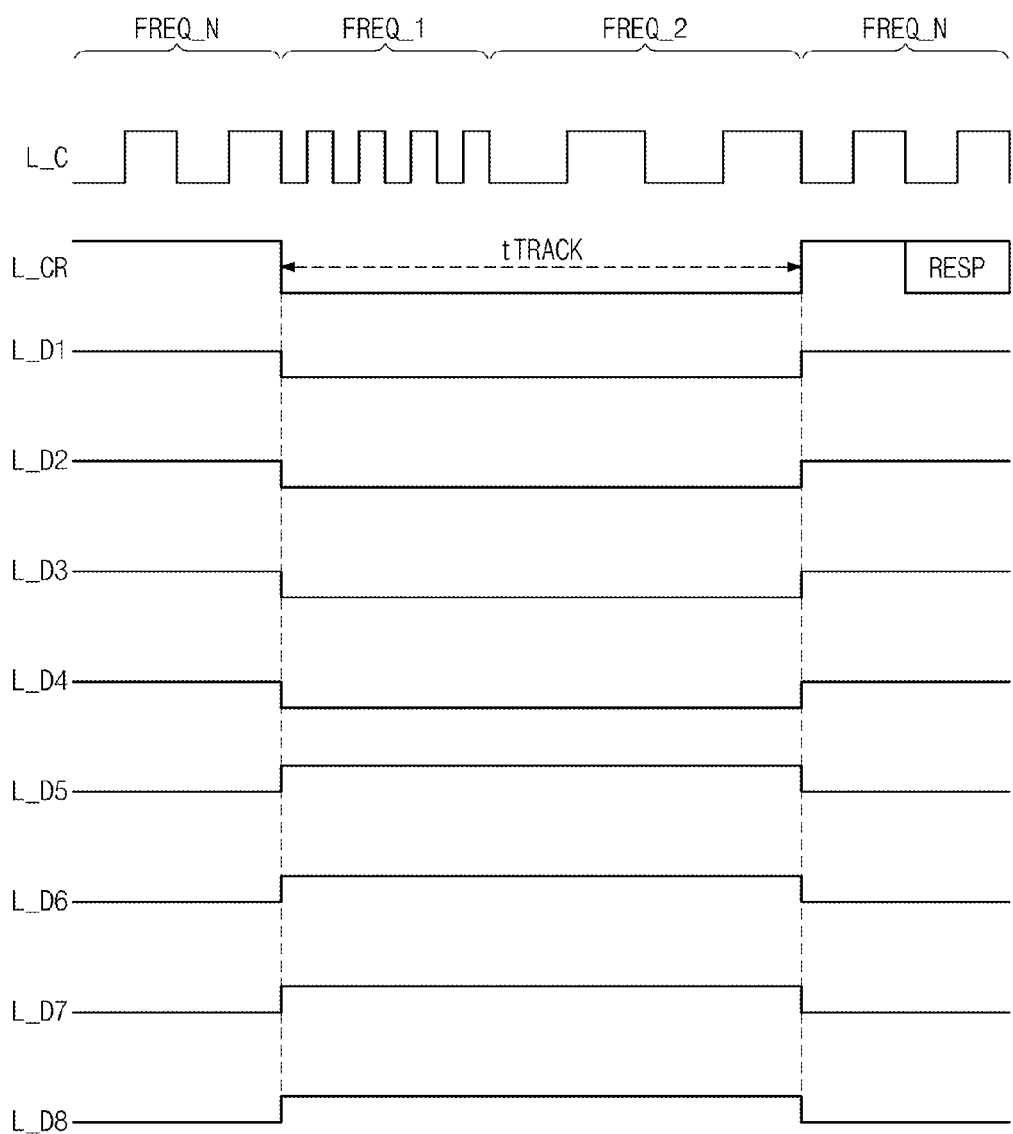

FIG. 11 is a timing diagram showing a variation (e.g., change in level) of a clock signal with a vendor pattern, according to at least a sixth example embodiment of the inventive concepts. Referring to FIGS. 1 through 3 and 11, signals that are exchanged between a storage controller 1110 and an interface and mode detection circuit 1325 through a clock signal line L_C, a command and response line L_CR, and first through eighth data lines L_D1 through L_D8 vary with the lapse of time.

As compared with a timing diagram shown in FIG. 6, when changing a frequency of a clock signal CLK to be transferred through the clock signal line L_C according to a vendor pattern, the host device drives the command and response line L_CR with a first level (e.g., logical low), half (e.g., D1 through D4) of the first through eighth data lines L_D1 through L_D8 with a second level (e.g., logical low), and the rest (e.g., D5 through D8) of the first through eighth data lines L_D1 through L_D8 with a third level (e.g., logical high). A clock signal tracker CLKT of a storage device 1300 tracks the clock signal CLK only if the command and response line L_CR is driven with the first level, half (e.g., D1 through D4) of the first through eighth data lines L_D1 through L_D8 are driven with the second level, and the rest (e.g., D5 through D8) of the first through eighth data lines L_D1 through L_D8 are driven with the third level. That is, a tracking time tTRACK when the clock signal CLK is tracked may be defined according to a level of the command and response line L_CR and levels of the first through eighth data lines L_D1 through L_D8.

As described with reference to FIG. 7, whether the storage device 1300 tracks the clock signal CLK is determined based on a level of the command and response line L_CR. Also, as described with reference to FIGS. 8 through 11, whether the storage device 1300 tracks the clock signal CLK may be determined based on a level of the command and response line L_CR and a pattern of levels of first through n-th data lines L_D1 through L_Dn. Besides, whether the storage device 1300 tracks the clock signal CLK is determined based on a pattern of levels of the first through n-th data lines L_D1 through L_Dn, regardless of a level of the command and response line L_CR.

Figure 12:
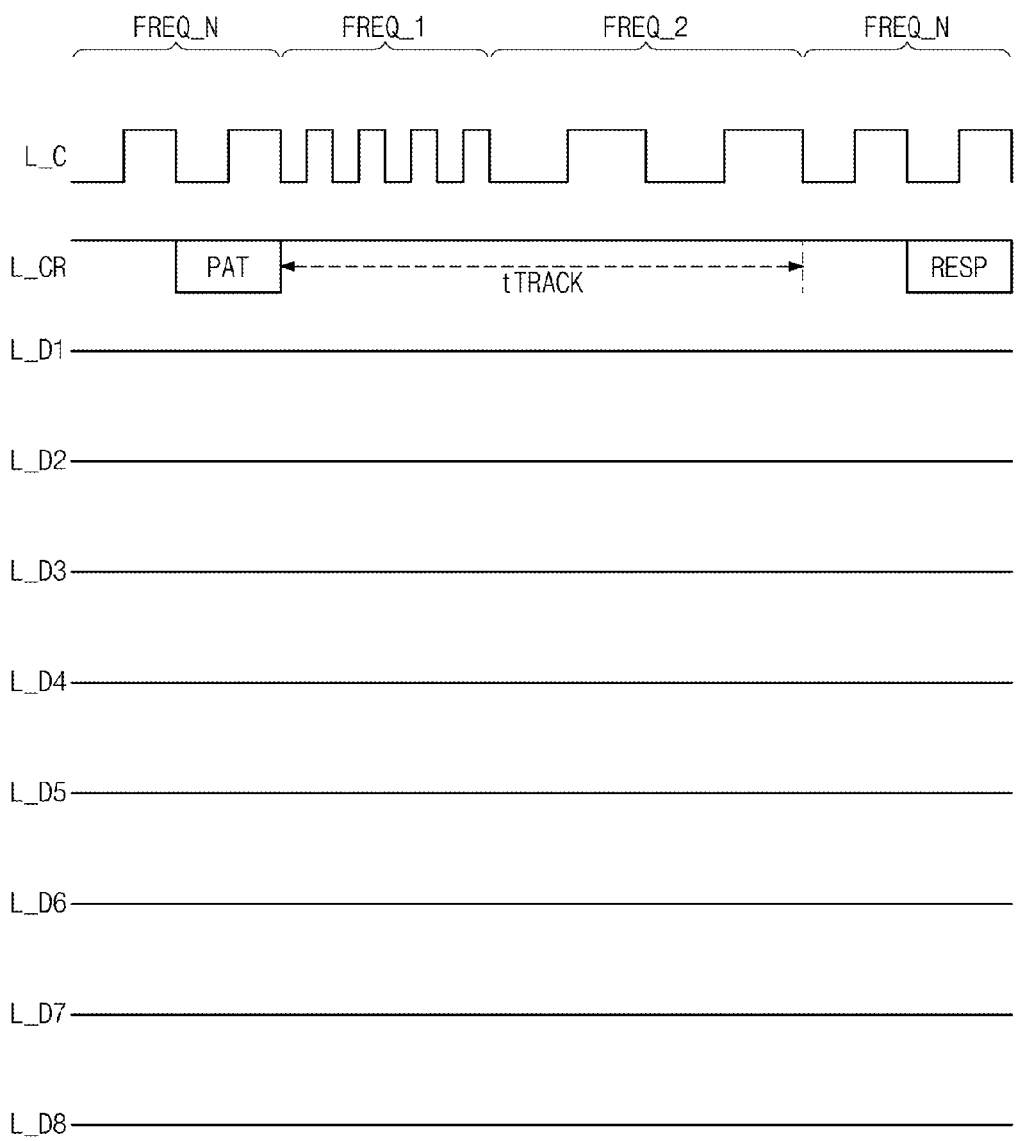

FIG. 12 is a timing diagram showing a variation (e.g., change in level) of a clock signal with a vendor pattern, according to at least a seventh example embodiment of the inventive concepts. Referring to FIGS. 1 through 3 and 12, signals that are exchanged between a storage controller 1110 and an interface and mode detection circuit 1325 through a clock signal line L_C, a command and response line L_CR, and first through eighth data lines L_D1 through L_D8 vary with the lapse of time.

As compared with a timing diagram shown in FIG. 6, when changing a frequency of a clock signal CLK to be transferred through the clock signal line L_C according to a vendor pattern, the host device outputs a predetermined pattern PAT onto the command and response line L_CR. When receiving the predetermined pattern PAT, a storage device 1300 tracks the clock signal CLK during a predetermined tracking time tTRACK.

As described with reference to FIGS. 7 through 11, the predetermined pattern may be received through at least one of data lines L_D1 through L_Dn as well as the command and response line L_CR. Also, the predetermined pattern may be received through at least one of the data lines L_D1 through L_Dn other than the command and response line L_CR. Patterns received through a plurality of lines may be identical to or different from each other.

Figure 13:
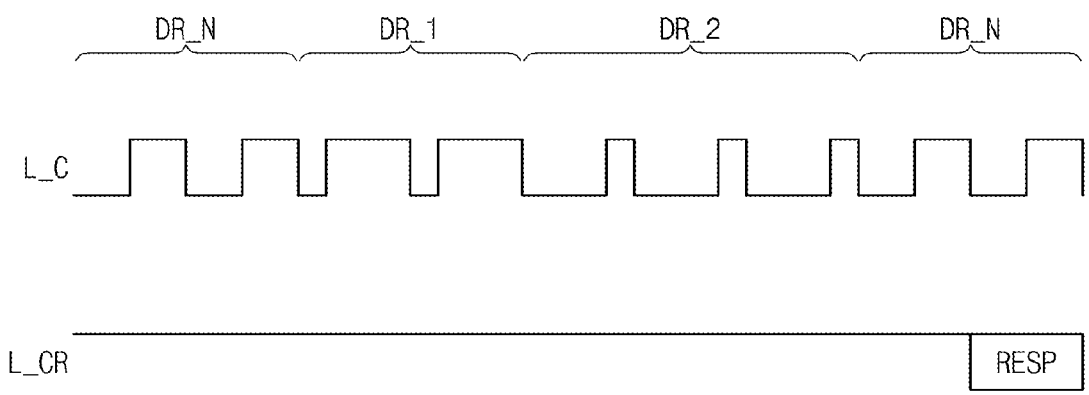

FIG. 13 is a timing diagram showing a variation of a clock signal with a vendor pattern, according to at least an eighth example embodiment of the inventive concepts. Referring to FIGS. 1 through 3 and 13, signals that are exchanged between a storage controller 1110 and an interface and mode detection circuit 1325 through a clock signal line L_C and a command and response line L_CR vary with the lapse of time.

At the beginning, a clock signal CLK transferred through the clock signal line L_C has a normal duty ratio DR_N. For example, the normal duty ratio DR_N may be a duty ratio corresponding to a communication mode that is selected by a host device and a storage device 1300. When entering a vendor mode or exiting from the vendor mode, the host device changes a duty ratio of the clock signal CLK according to a vendor pattern. For example, the host device changes a duty ratio of the clock signal CLK into a first duty ratio DR_1 and then into a second duty ratio DR_2. Afterwards, the host device restores a duty ratio of the clock signal CLK to the normal duty ratio DR_N.

The storage device 1300 enters or exits from the vendor mode when a duty ratio of the clock signal CLK is changed to the first duty ratio DR_1 and the second duty ratio DR_2. Entering the vendor mode, the storage device 1300 sends a response RESP, informing the entering of the vendor mode, to the host device through the command and response line L_CR. Exiting from vendor mode, the storage device 1300 sends a response RESP, informing that the vendor mode ends, to the host device through the command and response line L_CR.

The number of events that a duty ratio of the clock signal CLK varies with the vendor pattern may not be restricted. Also, duration times or the number of cycles (e.g., the number of events that a period of the clock signal CLK is iterated) over which the clock signal CLK has respective duty ratios (e.g., DR_1 or DR_2) according to the vendor pattern may be different from or equal to each other.

As described with reference to FIGS. 6 through 11, whether the storage device 1300 tracks the clock signal CLK is determined based on a level of the command and response line L_CR, a level of at least one of first through n-th data lines L_D1 through L_Dn or levels of the first through n-th data lines L_D1 through L_Dn, or a level of the command and response line L_CR and a level of at least one of the first through n-th data lines L_D1 through L_Dn or levels of the first through n-th data lines L_D1 through L_Dn.

Also, as described with reference to FIG. 12, whether the storage device 1300 tracks the clock signal CLK is determined based on a pattern received through the command and response line L_CR, a pattern received through at least one of the first through n-th data lines L_D1 through L_Dn, or a pattern received through the command and response line L_CR and a pattern received through at least one of the first through n-th data lines L_D1 through L_Dn.

Figure 14:
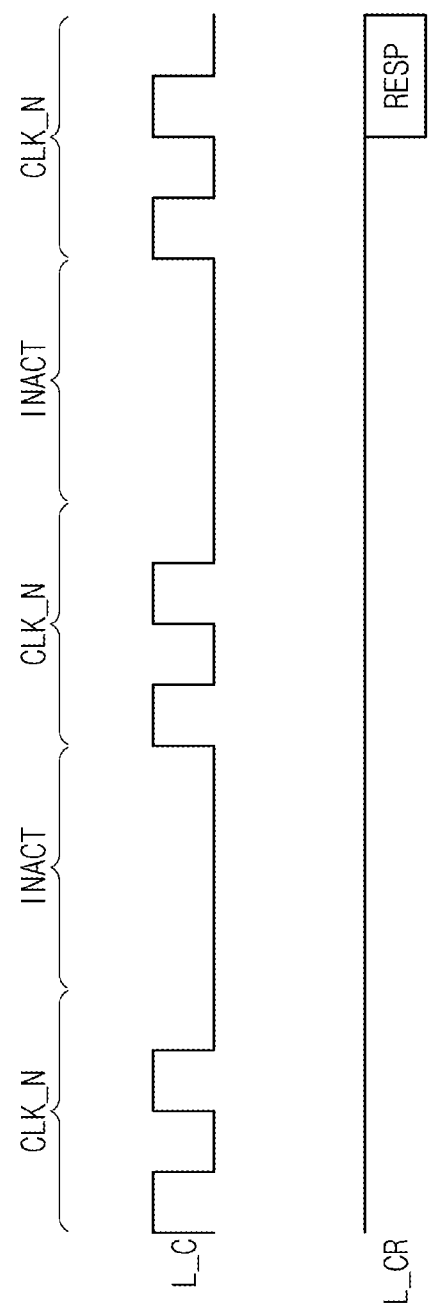

FIG. 14 is a timing diagram showing a variation (e.g., change in level) of a clock signal with a vendor pattern, according to at least a ninth example embodiment of the inventive concepts. Referring to FIGS. 1 through 3 and 14, signals that are exchanged between a storage controller 1110 and an interface and mode detection circuit 1325 through a clock signal line L_C and a command and response line L_CR vary with the lapse of time.

At the beginning, a clock signal CLK transferred through the clock signal line L_C has a normal state CLK_N. For example, the normal state CLK_N may be a state where the clock signal CLK has a low-to-high transition and a high-to-low transition periodically. When entering or exiting from a vendor mode, the host device changes a state of the clock signal CLK according to a vendor pattern. For example, the host device changes a state of the clock signal CLK into the following: inactive state INACT→normal state CLK_N→inactive state INACT. Afterwards, the host device restores a state of the clock signal CLK to the normal state CLK_N. The inactive state INACT may be a state where the clock signal CLK remains at a predetermined level (e.g., logical low) without low-to-high and high-to-low transitions.

The storage device 1300 enters or exits from the vendor mode when a state of the clock signal CLK is changed. Entering the vendor mode, the storage device 1300 sends a response RESP, informing the entering of the vendor mode, to the host device through the command and response line L_CR. Exiting from vendor mode, the storage device 1300 sends a response RESP, informing that the vendor mode ends, to the host device through the command and response line L_CR.

The number of events that a state of the clock signal CLK varies with the vendor pattern may not be restricted. Also, duration times or the number of cycles (e.g., the number of events that a period of the clock signal CLK is iterated) when the clock signal CLK has respective states (e.g., INACT or CLK_N) according to the vendor pattern may be different from or equal to each other.

As described with reference to FIGS. 6 through 11, whether the storage device 1300 tracks the clock signal CLK is determined based on a level of the command and response line L_CR, a level of at least one of first through n-th data lines L_D1 through L_Dn or levels of the first through n-th data lines L_D1 through L_Dn, or a level of the command and response line L_CR and a level of at least one of the first through n-th data lines L_D1 through L_Dn or levels of the first through n-th data lines L_D1 through L_Dn.

Also, as described with reference to FIG. 12, whether the storage device 1300 tracks the clock signal CLK is determined based on a pattern received through the command and response line L_CR, a pattern received through at least one of the first through n-th data lines L_D1 through L_Dn, or a pattern received through the command and response line L_CR and a pattern received through at least one of the first through n-th data lines L_D1 through L_Dn.

FIG. 15 is a table showing embodiments of a vendor pattern indicating an entry or end of a vendor mode. Referring to FIG. 15, a vendor pattern may be implemented according to elements of the vendor pattern, lengths of elements of the vendor pattern, and a tracking time tTRACK.

In $1^{st}$ through $12^{th}$ embodiments, elements of the vendor pattern may be frequencies of a clock signal CLK. Whether to enter or exit from a vendor mode may be determined by changing a frequency of the clock signal CLK.

In the $1^{st}$ through 3rd embodiments, duration times when the clock signal CLK has each frequency according to the vendor pattern are the same. In the $1^{st}$ embodiment, as described with reference to FIG. 6, the tracking time tTRACK may not be defined. In the $2^{nd}$ embodiment, as described with reference to FIGS. 7 through 11, the tracking time tTRACK is defined by a level of a command and response line L_CR, a level of at least one of first through n-th data lines L_D1 through L_Dn or levels of the first through n-th data lines L_D1 through L_Dn, or a level of the command and response line L_CR and a level of at least one of the first through n-th data lines L_D1 through L_Dn or levels of the first through n-th data lines L_D1 through L_Dn.

In the 3rd embodiment, as described with reference to FIG. 12, the tracking time tTRACK is defined by a pattern received through the command and response line L_CR, a pattern received through at least one of the first through n-th data lines L_D1 through L_Dn, or a pattern received through the command and response line L_CR and a pattern received through at least one of the first through n-th data lines L_D1 through L_Dn.

In the 4$^{th}$ through 6$^{th}$ embodiments, the numbers for which the clock signal CLK has respective ones of the different frequencies are fixed. The 4$^{th}$ through 6$^{th}$ embodiments are distinguishable from each other according to a method in which the tracking time tTRACK is defined.

In the 7$^{th}$ through 9$^{th}$ embodiments, duration times during which the clock signal CLK has respective ones of the different frequencies according to the vendor pattern are different from each other. The 7$^{th}$ through 9$^{th}$ embodiments are distinguishable from each other according to a method in which the tracking time tTRACK is defined.

In the 10$^{th}$ through 12$^{th}$ embodiments, the numbers of cycles (i.e., where a 'cycle' is an iteration of a period of the clock signal CLK) over which the clock signal CLK maintains respective ones of the different frequencies are different from each other. The 10$^{th}$ through 12$^{th}$ embodiments are distinguishable from each other according to a method in which the tracking time tTRACK is defined.

In 13$^{th}$ through 18$^{th}$ embodiments, elements of the vendor pattern may be duty ratios of a clock signal CLK. Whether to enter or exit from a vendor mode may be determined by changing a duty ratio of the clock signal CLK.

In the 13$^{th}$ through 15$^{th}$ embodiments, duration times (or, alternatively, the number of cycles) during which the clock signal CLK maintains respective ones of different duty ratios are the same. The 13$^{th}$ through 15$^{th}$ embodiments are distinguishable from each other according to a method in which the tracking time tTRACK is defined.

In the 16$^{th}$ through 18$^{th}$ embodiments, duration times (or, alternatively, the number of cycles) during which the clock signal CLK maintains respective ones of different duty ratios are different from each other. The 16$^{th}$ through 18$^{th}$ embodiments are distinguishable from each other according to a method in which the tracking time tTRACK is defined.

In the 19$^{th}$ through 24$^{th}$ embodiments, elements of a vendor pattern may be activation and inactivation of the clock signal CLK. Whether to enter or exit from the vendor mode is determined by changing a state of the clock signal CLK.

In the 19$^{th}$ through 21$^{st}$ embodiments, duration times (or, alternatively, the number of cycles) during which the clock signal CLK maintains different ones of the states (i.e., active or inactive) are the same. The 19$^{th}$ through 21$^{st}$ embodiments are distinguishable from each other according to a method in which the tracking time tTRACK is defined.

In the 22$^{nd}$ through 24$^{th}$ embodiments, duration times (or, alternatively, the number of cycles) during which the clock signal CLK maintains different ones of the states (i.e., active or inactive) are different from each other. The 22$^{nd}$ through 24$^{th}$ embodiments are distinguishable from each other according to a method in which the tracking time tTRACK is defined.

The 2$^{nd}$, 5$^{th}$, 8$^{th}$, 11$^{th}$, 14$^{th}$, 17$^{th}$, 20$^{th}$, and 23$^{rd}$ embodiments may be divided into detailed embodiments according to a level of the command and response line L_CR and a pattern of levels of first through n-th data lines L_D1 through L_Dn.

Also, the 3rd, 6$^{th}$, 9$^{th}$, 12$^{th}$, 15$^{th}$, 18$^{th}$, 21$^{st}$, and 24$^{th}$ embodiments may be divided into detailed embodiments according to the number and kind of lines, through which a pattern is transferred, from among the command and response line L_CR and the first through n-th data lines L_D1 through L_Dn and according to a kind of a pattern.

In accordance with at least some example embodiments of the inventive concepts, a plurality of vendor modes may be provided. If a clock signal CLK is controlled according to a first vendor pattern, a host device and a storage device 1300 enter a first vendor mode. In the first vendor mode, first vendor operations may be allowed. If the clock signal CLK is controlled according to a second vendor pattern, the host device and the storage device 1300 enter a second vendor mode. In the second vendor mode, second vendor operations different from the first vendor operations may be allowed.

Figure 16:
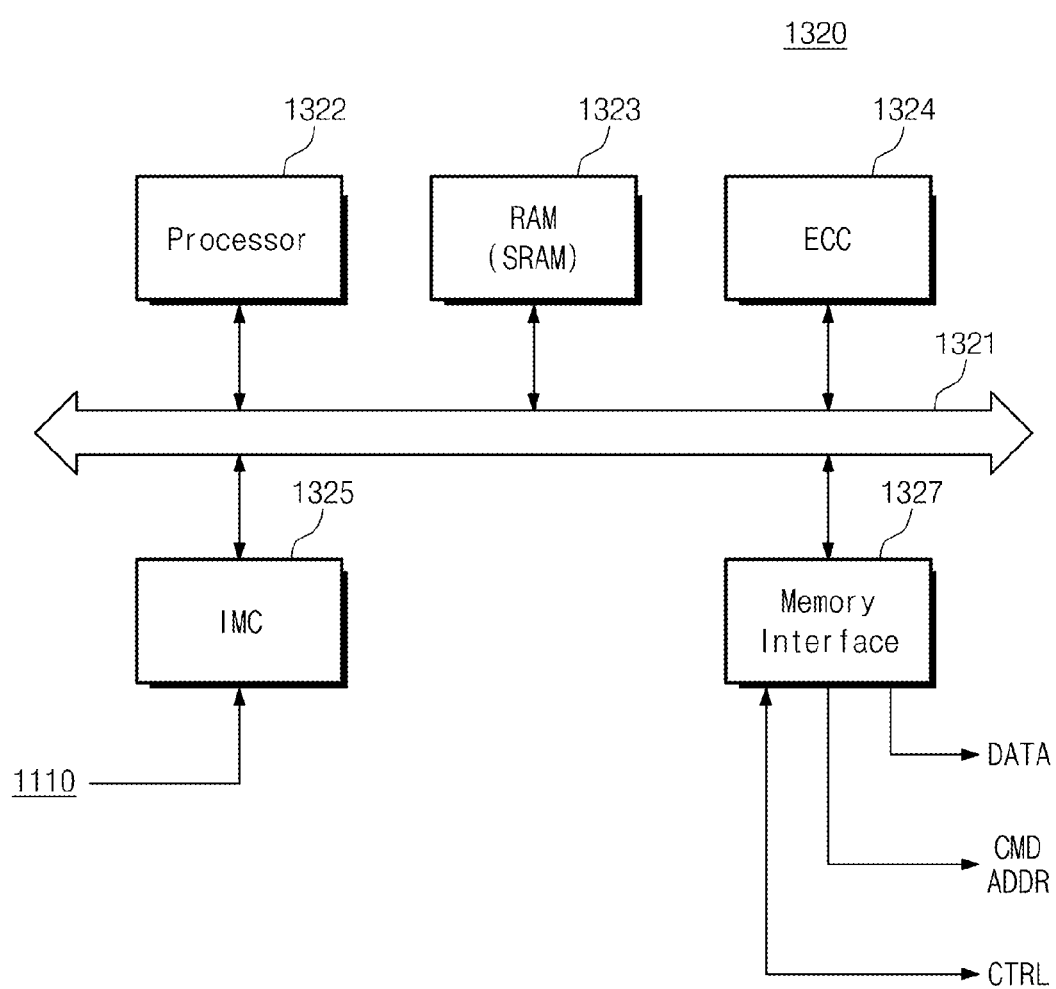
FIG. 16 is a block diagram schematically illustrating a memory controller according to at least one example embodiment of the inventive concepts.

FIG. 16 is a block diagram schematically illustrating a memory controller 1320 according to at least one example embodiment of the inventive concepts. Referring to FIG. 16, a memory controller 120 contains a bus 1321, a processor 1322, a RAM 1323, an ECC block 1324, an interface and mode detection circuit 1325, and a memory interface 1327.

The bus 1321 is configured to provide a channel among components of the memory controller 120.

The processor 1322 controls an overall operation of the memory controller 1320 and executes a logical operation. The processor 1322 communicates with an external host device 1100 (refer to FIG. 1) through the interface and mode detection circuit 1325. The processor 1322 exchanges data and a control signal CTRL with a nonvolatile memory 1310 through the memory interface 1327. The processor 1322 outputs a command CMD and an address ADDR to the nonvolatile memory 1310. According to at least one example embodiment of the inventive concepts, operations described herein as being performed by the storage device 1300 may be performed by, or, alternatively, under the control of, the processor 1322.

The processor 1322 stores the command received through the interface and mode detection circuit 1325 at the RAM 1323. The processor 1322 stores data received through the interface and mode detection circuit 1325 at the RAM 1323. The processor 1322 changes a command CMD stored at the RAM 1323 to be suitable for the nonvolatile memory 1310 and outputs the changed command to the nonvolatile memory 1310. The processor 1322 outputs data stored at the RAM 1323 through the memory interface 1327. The processor 1322 stores data received through the memory interface 1327 at the RAM 1323. The processor 1322 outputs data stored at the RAM 1323 through the interface and mode detection circuit 1325. In at least some example embodiments of the inventive concepts, the processor 1322 may include a direction memory access (DMA) and outputs data using the DMA.

In at least some example embodiments of the inventive concepts, when a buffer memory is provided outside the memory controller 1320, data may be stored at the external buffer memory instead of the RAM 1323.

The RAM 1323 is used as a working memory, a cache memory, or a buffer memory of the processor 1322. The RAM 1323 stores codes or instructions that the processor 122 will execute. The RAM 1323 stores data processed by the processor 1322. The RAM 1323 may include an SRAM.

The ECC block 1324 performs an error correction operation. The ECC block 1324 generates parity for error correction, based on data to be output to the memory interface 1327. The data and parity may be output through the memory interface 1327. The ECC block 1324 corrects an error of data using data and parity that are received through the memory interface 1327. The ECC block 1324 may be implemented as a component of the memory interface 1327. The ECC block 1324 may be, or be included in, circuitry or a circuit. Alternatively, the ECC block may be implemented by a processor executing instructions that are stored in the storage device 1300 and correspond to the functions described herein as being performed by the ECC block 1324.

The interface and mode detection circuit 1325 communicates with an external host device according to a control of the processor 1322. The interface and mode detection circuit 1325 tracks a clock signal CLK from the host device and compares the tracked clock signal CLK with a vendor pattern. The interface and mode detection circuit 1325 controls entering and exiting from a vendor mode based on the comparison result.

The interface and mode detection circuit 1325 may use at least one of the following methods for communications: USB (Universal Serial Bus), SATA (Serial AT Attachment), SAS (Serial Attached SCSI), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), and eMMC (embedded MMC).

The memory interface 1327 communicates with the nonvolatile memory 1310 according to a control of the processor 1322.

In at least some example embodiments of the inventive concepts, the processor 1322 controls the memory controller 1320 using codes. The processor 1322 may load codes from a nonvolatile memory (e.g., read only memory) that is implemented in the memory controller 1320. In at least some other example embodiments of the inventive concepts, the processor 1322 may load codes received from the memory interface 1327.

Figure 17:
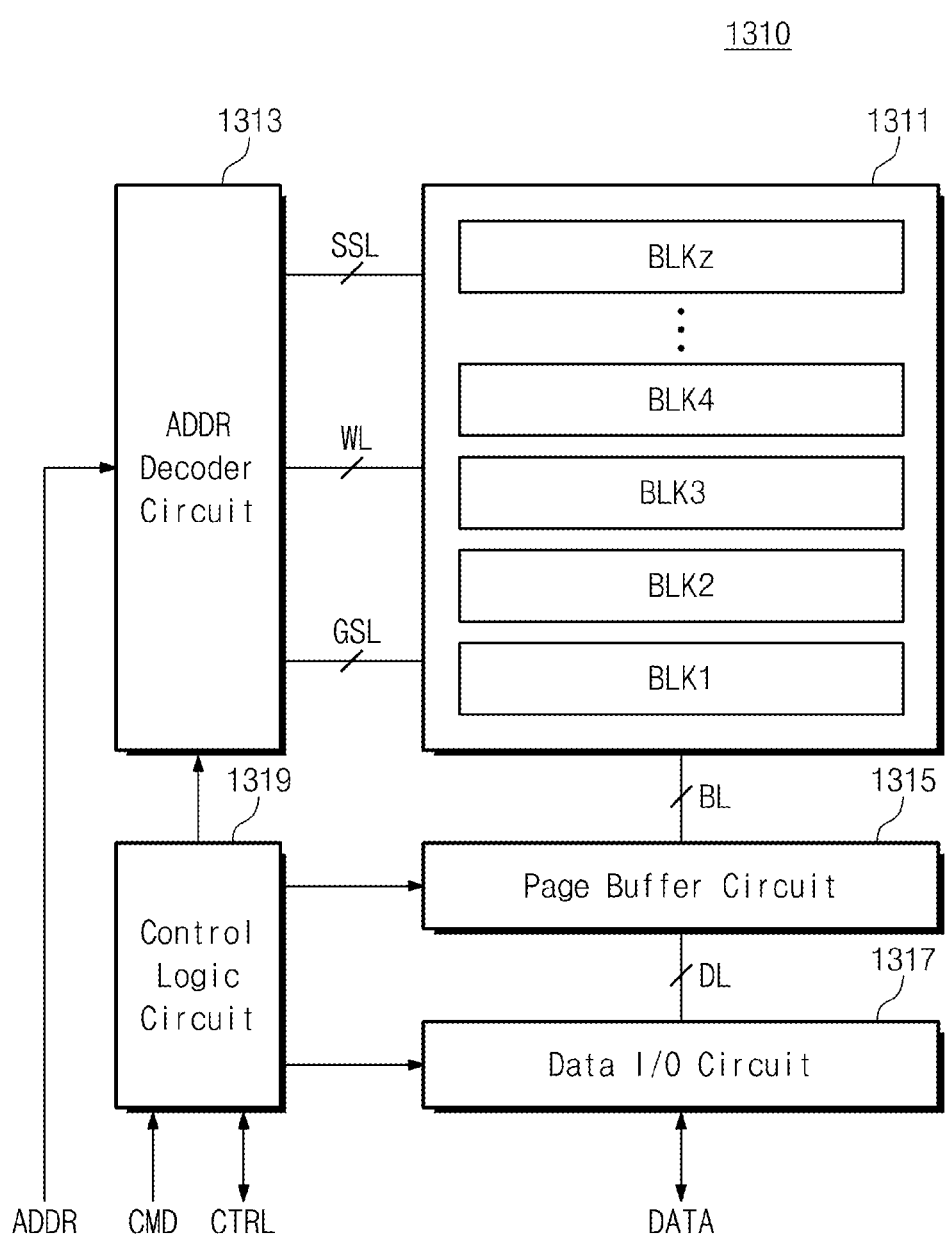
FIG. 17 is a block diagram schematically illustrating a nonvolatile memory according to at least one example embodiment of the inventive concepts.

FIG. 17 is a block diagram schematically illustrating a nonvolatile memory 1310 according to at least one example embodiment of the inventive concepts. Referring to FIGS. 1 and 17, a nonvolatile memory 1310 includes a memory cell array 1311, an address decoder circuit 1313, a page buffer circuit 1315, a data input/output circuit 1317, and a control logic circuit 1319.

The memory cell array 1311 includes a plurality of memory blocks BLK1 through BLKz, each of which has a plurality of memory cells. Each memory block is connected to the address decoder circuit 1313 through at least one string selection line SSL, a plurality of word lines WL, and at least one ground selection line GSL. Each memory block is connected to the page buffer circuit 1315 through a plurality of bit lines BL. The memory blocks BLK1 through BLKz may be connected in common to the plurality of bit lines BL. Memory cells of the memory blocks BLK1 through BLKz may have the same structure. In at least some example embodiments of the inventive concepts, each of the memory blocks BLK1 through BLKz may be an erase unit. An erase operation may be carried out by the memory block. Memory cells of a memory block may be erased at the same time. In at least some other example embodiments of the inventive concepts, each sub block may be an erase unit.

The address decoder circuit 1313 is connected to the memory cell array 1311 through a plurality of ground selection lines GSL, a plurality of word lines WL, and a plurality of string selection lines SSL. The address decoder circuit 1313 operates in response to a control of the control logic circuit 1319. The address decoder circuit 1313 receives an address from a memory controller 1320. The address decoder circuit 113 decodes the input address and controls voltages to be applied to the word lines WL depending on the decoded address.

For example, at programming, the address decoder circuit 1313 applies a program voltage to a selected word line of a selected memory block that the address points out. The address decoder circuit 1313 also applies a pass voltage to unselected word lines of the selected memory block. At reading, the address decoder circuit 1313 applies a selection read voltage to a selected word line of a selected memory block that the address points out. The address decoder circuit 1313 also applies a non-selection read voltage to unselected word lines of the selected memory block. At erasing, the address decoder circuit 1313 applies an erase voltage (e.g., ground voltage) to word lines of a selected memory block that the address points out.

The page buffer circuit 1315 is connected to the memory cell array 1311 through the bit lines BL. The page buffer circuit 1315 is connected to the data input/output circuit 1317 through a plurality of data lines DL. The page buffer circuit 1315 operates in response to a control of the control logic circuit 1319.

The page buffer circuit 1315 holds data to be programmed at memory cells of the memory cell array 1311 or data read from memory cells thereof. During a program operation, the page buffer circuit 1315 stores data to be stored in memory cells. The page buffer circuit 1315 biases the plurality of bit lines BL based on the stored data. The page buffer circuit 1315 serves as a write driver at a program operation. During a read operation, the page buffer circuit 1315 senses voltages of the bit lines BL and stores the sensed results. The page buffer circuit 1315 serves as a sense amplifier at a read operation.

The data input/output circuit 1317 is connected to the page buffer circuit 1315 through the data lines DL. The data input/output circuit 1317 exchanges data with the memory controller 1320.

The data input/output circuit 1317 temporarily stores data that the memory controller 1320 provides, and it transfers the temporarily stored data to the page buffer circuit 1315. The data input/output circuit 1317 temporarily stores data transferred from the page buffer circuit 1315 and transfers it to the memory controller 1320. The data input/output circuit 1317 serves as a buffer memory.

The control logic circuit 1319 receives a command and a control signal CTRL from the memory controller 1320. The control logic circuit 1319 decodes the command thus received and controls an overall operation of the nonvolatile memory 1310 according to the decoded command.

In at least some example embodiments of the inventive concepts, during a read operation, the control logic circuit 1319 may generate a data strobe signal DQS depending on a read enable signal /RE of the received control signal CTRL. During a write operation, the control logic circuit 1319 may generate a data strobe signal DQS depending on a data strobe signal DQS of the received control signal CTRL.

Figure 18:
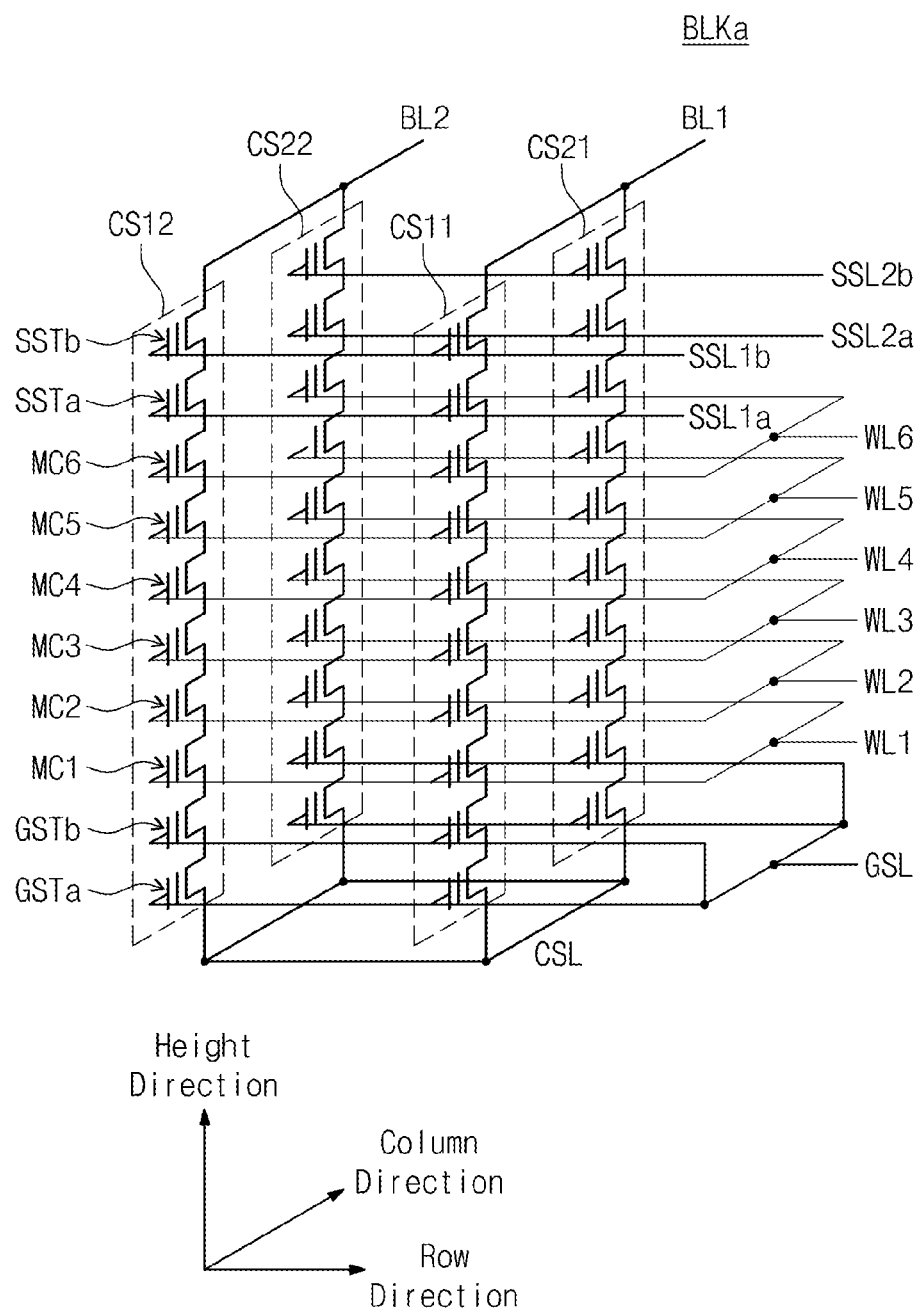
FIG. 18 is a circuit diagram schematically illustrating a memory block according to at least one example embodiment of the inventive concepts.

FIG. 18 is a circuit diagram schematically illustrating a memory block BLKa according to at least one example embodiment of the inventive concepts. Referring to FIG. 18, a memory block BLKa includes a plurality of cell strings CS11 through CS21 and CS12 through CS22. The plurality of cell strings CS11 through CS21 and CS12 through CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., plane above a substrate of the memory block BLKa) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa are connected in common to a common source line CSL.

The ground selection transistors GSTa and GSTb of the plurality of cell strings CS11 through CS21 and CS12 through CS22 are connected in common to a ground selection line GSL.

In at least some example embodiments of the inventive concepts, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line.

In at least some example embodiments of the inventive concepts, ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line and the ground selection transistors GSTa and GSTb of the cell strings CS21 and CS22 in the second row are connected in common to the second ground selection line.

Connected in common to a word line are memory cells that are placed at the same height (or, order) from the substrate (or, the ground selection transistors GST). Connected to different word lines WL1 through WL6 are memory cells that are placed at different heights (or, orders). For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 through CS21 and CS12 through CS22, the first string selection transistors SSTa in different rows are connected to different string selection lines SSL1a and SSL2a. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

In second string selection transistors SSTb, having the same height (or, order), of the cell strings CS11 through CS21 and CS12 through CS22, the second string selection transistors SSTb in different rows are connected to the different string selection lines SSL1a and SSL2a. For example, the second string selection transistors SSTb of the cell strings CS11 and CS12 are connected in common to the string selection line SSL1b, and the second string selection transistors SSTb of the cell strings CS21 and CS22 are connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In at least some example embodiments of the inventive concepts, string selection transistors of cell strings in the same row may be connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 through CS21 and CS12 through CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

The cell strings CS11 and CS12 form a first plane, and the cell strings CS21 and CS22 form a second plane.

A write and a read operation of the memory block BLKa may be performed by the row. For example, one plane is selected by the string selection lines SSL1a, SSL1b, SSL2a, and SSL2b. Connected to the bit lines BL1 and BL2 are cell strings CS11 and CS12 of the first plane when a turn-on voltage is applied to the string selection lines SSL1a and SSL1b and a turn-off voltage is supplied to the string selection lines SSL2a and SSL2b. That is, the first plane is selected. Connected to the bit lines BL1 and BL2 are cell strings CS21 and CS22 of the second plane when a turn-on voltage is applied to the string selection lines SSL2a and SSL2b and a turn-off voltage is supplied to the string selection lines SSL1a and SSL1b. That is, the second plane is selected. In a selected plane, a row of memory cells may be selected by word lines WL1 to WL6. A read or a write operation may be performed with respect to the selected row.

An erase operation on the memory block BLKa may be performed by the block or by the sub block. All of memory cells of a memory block BLKa may be erased when the erase operation is performed by the memory block. The erase operation being performed by the sub block, a part of memory cells of the memory block BLKa may be erased, and the rest thereof may be erase-inhibited. A low voltage (e.g., ground voltage) is supplied to a word line connected to memory cells to be erased, and a word line connected to memory cells to be erase-inhibited is floated.

The memory block BLKa shown in FIG. 18 is an example. However, the scope and spirit of at least some example embodiments of the inventive concepts may not be limited thereto. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In at least one example embodiment of the inventive concepts, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In at least one example embodiment of the inventive concepts, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 19:
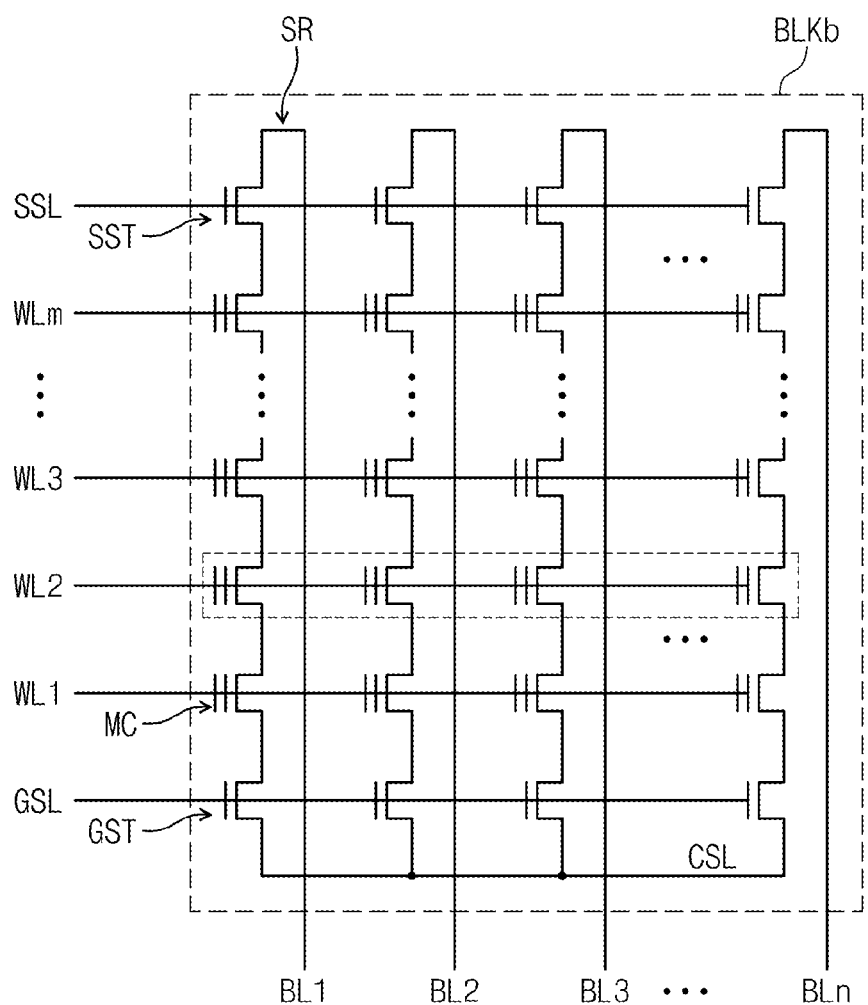
FIG. 19 is a circuit diagram schematically illustrating a memory block according to at least one other example embodiment of the inventive concepts.

FIG. 19 is a circuit diagram schematically illustrating a memory block BLKb according to at least one other example embodiment of the inventive concepts. Referring to FIG. 19, a memory block BLKb includes a plurality of strings SR, which are connected to a plurality of bit lines BL1 through BLn, respectively. Each string SR contains a ground selection transistor GST, memory cells MC, and a string selection transistor SST.

In each string SR, the ground selection transistor GST is connected between the memory cells MC and a common source line CSL. The ground selection transistors GST of the strings SR are connected in common to the common source line CSL.

In each string SR, the string selection transistor SST is connected between the memory cells MC and a bit line BL. The string selection transistors SST of the strings SR are connected to a plurality of bit lines BL1 through BLn, respectively.

In each string SR, the plurality of memory cells MC are connected between the ground selection transistor GST and the string selection transistor SST. In each string SR, the plurality of memory cells MC are connected in series.

In the strings SR, memory cells MC having the same height from the common source line CSL are connected in common to a word line. The memory cells MC of the strings SR are connected to a plurality of word lines WL1 through WLm.

In the memory block BLKb, an erase operation is performed by the memory block. When the erase operation is performed by the memory block, all memory cells of the memory block BLKb are simultaneously erased according to an erase request.

In accordance with at least some example embodiments of the inventive concepts, a storage device may enter a vendor mode using a clock signal. In the vendor mode, optimization and management on a state of the storage device may be made. Thus, there are provided the storage device with improved performance and reliability and an operating method thereof.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An operating method of a storage device which includes a nonvolatile memory and a memory controller configured to control the nonvolatile memory, the operating method comprising:
tracking a clock signal;
entering a vendor mode of the storage device when the clock signal corresponds to a vendor pattern; and
maintaining a normal mode of the storage device when the clock signal does not correspond to the vendor pattern,
wherein, in the normal mode, a command received from an external host device is executed according to a first rule, and
wherein, in the vendor mode, the command received from the external host device is executed according to a second rule different from the first rule,
wherein the vendor pattern includes a pattern in which a waveform of the clock signal includes a plurality of different frequencies.

2. The operating method of claim 1, wherein the clock signal is received through a first signal line and the command is received through a second signal line different from the first signal line.

3. The operating method of claim 1, wherein a storage space, corresponding to an address included in the command, from among a storage space of the nonvolatile memory is accessed in response to the command and according to the first rule.

4. The operating method of claim 1, wherein an operation indicated by an address included in the command is performed according to the second rule.

5. The operating method of claim 4, wherein the address indicates at least one of an operation of reading meta data from the nonvolatile memory and an operation of reading information on a state of the storage device.

6. The operating method of claim 1, wherein the vendor pattern includes a pattern in which duration times during which the clock signal maintains respective ones of the plurality of different frequencies are different from each other.

7. The operating method of claim 1, wherein, in the vendor pattern, duration times during which the clock signal maintains respective ones of the plurality of different frequencies are the same.

8. The operating method of claim 1, wherein the vendor pattern includes a pattern in which the numbers of cycles over which the clock signal maintains respective ones of the plurality of different frequencies are different from each other.

9. The operating method of claim 1, wherein in the vendor pattern, the numbers of cycles over which the clock signal maintains respective ones of the plurality of different frequencies are the same.

10. The operating method of claim 1, wherein the vendor pattern includes a pattern in which a wave form of the clock signal may include a plurality of different duty ratios.

11. The operating method of claim 10, wherein the vendor pattern includes a pattern in which duration times during which the clock signal maintains respective ones of the plurality of different duty ratios are different from each other.

12. The operating method of claim 10, wherein in the vendor pattern, duration times during which the clock signal maintains respective ones of the plurality of difference duty ratios are the same.

13. The operating method of claim 1, wherein the vendor pattern includes a pattern of active and inactive intervals of the clock signal.

14. The operating method of claim 1, wherein the tracking operation is performed in response to a pattern in which a second signal line is driven, the second signal line being a signal line that transfers the command to the storage device.

15. The operating method of claim 1, wherein the tracking operation is performed in response to a pattern in which third signal lines are driven, the third signal lines being signal lines that exchange data between the external host and the storage device.

16. The operating method of claim 1, wherein the tracking of a clock signal is performed while a second signal line for transferring the command is driven with a specific level and third signal lines exchanging data with the external host device are respectively driven with specific levels according to a specific pattern.

17. The operating method of claim 1, further comprising:
transferring a response signal through a command and response line through which the command is transferred, the response signal indicating that entry of the storage device into the vendor mode is completed.

18. A method comprising:
receiving, at a storage device, a clock signal,
determining a pattern of the clock signal,
receiving, at the storage device, a command for accessing the storage device;
executing the command at the storage device according to a first rule, when the pattern of the clock signal corresponds to a first pattern; and
executing the command at the storage device according to a second rule, when the pattern of the clock signal corresponds to a second pattern,
the first rule and the first pattern being different than the second rule and the second pattern, respectively,
wherein the first pattern includes patterns in which a waveform of the clock signal includes a plurality of different frequencies.

19. The method of claim 18, further comprising:
receiving, at the storage device, one or more tracking time initiation signals; and
receiving, at the storage device, one or more tracking time ending signals,
wherein the determining is performed only during a tracking time, the tracking time beginning in response to the one or more tracking time initiation signals, the tracking time ending in response to the one or more tracking time ending signals.

* * * * *